(12) United States Patent
Moon et al.

(10) Patent No.: US 11,356,098 B2
(45) Date of Patent: Jun. 7, 2022

(54) TRANSMITTER AND RECEIVER FOR LOW POWER INPUT/OUTPUT AND MEMORY SYSTEM INCLUDING THE SAME

(71) Applicant: SAMSUNG ELECTRONICS CO., LTD., Suwon-si (KR)

(72) Inventors: Byongmo Moon, Seoul (KR); Jiyoung Kim, Seoul (KR); Seongook Jung, Seoul (KR); Jongsoo Lee, Seoul (KR)

(73) Assignees: SAMSUNG ELECTRONICS CO., LTD., Suwon-si (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 17/353,917

(22) Filed: Jun. 22, 2021

(65) Prior Publication Data
US 2022/0069822 A1 Mar. 3, 2022

(30) Foreign Application Priority Data
Aug. 26, 2020 (KR) .......................... 10-2020-0107701

(51) Int. Cl.
| | |
|---|---|
| G11C 7/10 | (2006.01) |
| H03K 19/173 | (2006.01) |
| H03K 19/0175 | (2006.01) |
| G11C 7/22 | (2006.01) |
| H03K 19/17788 | (2020.01) |

(Continued)

(52) U.S. Cl.
CPC ........... *H03K 19/1737* (2013.01); *G11C 7/14* (2013.01); *G11C 7/222* (2013.01); *H03K 19/01742* (2013.01); *H03K 19/017509* (2013.01); *H03K 19/17788* (2013.01)

(58) Field of Classification Search
CPC .... G11C 7/14; G11C 7/222; H03K 19/01742; H03K 19/017509; H03K 19/1737; H03K 19/17788
See application file for complete search history.

(56) References Cited

U.S. PATENT DOCUMENTS

| | | | | |
|---|---|---|---|---|
| 3,633,105 A | * | 1/1972 | Lender .............. | H04L 25/03038 375/236 |
| 4,118,686 A | * | 10/1978 | Lender ................. | H04L 25/497 375/292 |

(Continued)

*Primary Examiner* — Kurtis R Bahr
(74) *Attorney, Agent, or Firm* — F. Chau & Associates, LLC

(57) ABSTRACT

A transmitter includes a multiplexer, control logic and a voltage mode driver. The multiplexer generates a plurality of time-interleaved data signals based on a plurality of input data signals and multi-phase clock signals. The plurality of input data signals are input in parallel. Each of the plurality of input data signals is a binary signal and has two voltage levels that are different from each other. The control logic generates at least one pull-down control signal and a plurality of pull-up control signals based on the plurality of time-interleaved data signals. Each of the plurality of pull-up control signals has a voltage level that is temporarily boosted. The voltage mode driver generates an output data signal based on the at least one pull-down control signal and the plurality of pull-up control signals. The output data signal is a duobinary signal and has three voltage levels that are different from each other.

20 Claims, 19 Drawing Sheets

(51) Int. Cl.
*G11C 7/14* (2006.01)
*H03K 19/017* (2006.01)

(56) References Cited

U.S. PATENT DOCUMENTS

| | | | |
|---|---|---|---|
| 6,396,329 B1* | 5/2002 | Zerbe | G11C 7/02 |
| | | | 327/319 |
| 6,623,188 B1* | 9/2003 | Dimmick | H04B 10/25137 |
| | | | 398/182 |
| 7,508,882 B2 | 3/2009 | Adamiecki et al. | |
| 9,209,966 B1 | 12/2015 | Hossain et al. | |
| 9,215,116 B2 | 12/2015 | Eiselt | |
| 9,536,807 B2 | 1/2017 | Kim | |
| 10,541,010 B2 | 1/2020 | Hollis | |
| 2002/0181064 A1* | 12/2002 | Rosenkranz | H03M 7/06 |
| | | | 398/183 |
| 2009/0092396 A1* | 4/2009 | Lyubomirsky | H04L 5/06 |
| | | | 398/89 |
| 2009/0232248 A1* | 9/2009 | Fukaishi | H03F 3/45744 |
| | | | 375/291 |
| 2010/0232541 A1* | 9/2010 | Fukaishi | H04L 25/4912 |
| | | | 375/291 |
| 2013/0278296 A1* | 10/2013 | Amirkhany | H03K 3/01 |
| | | | 327/108 |
| 2017/0070295 A1* | 3/2017 | Remein | H04J 14/0282 |
| 2017/0186448 A1* | 6/2017 | Wilson | G11B 20/10027 |
| 2017/0207946 A1 | 7/2017 | Dickson et al. | |

* cited by examiner

FIG. 4C

|   | t1 | t2 | t3 | t4 |
|---|----|----|----|----|
| X | 0  | 0  | 1  | 1  |
| Y | 0  | 0  | 0  | 1  |

FIG. 4D

|        | t1 | t2 | t3 | t4 |
|--------|----|----|----|----|
| PD     | 1  | 1  | 0  | 0  |
| PUMID  | 0  | 0  | *1 | 0  |
| PUHIGH | 0  | 0  | 0  | *1 |

TRANSMITTER AND RECEIVER FOR LOW POWER INPUT/OUTPUT AND MEMORY SYSTEM INCLUDING THE SAME

CROSS-REFERENCE TO RELATED APPLICATION

This application claims priority under 35 USC § 119 to Korean Patent Application No. 10-2020-0107701 filed on Aug. 26, 2020 in the Korean Intellectual Property Office (KIPO), the disclosure of which is herein incorporated by reference in its entirety.

TECHNICAL FIELD

Embodiments of the present disclosure relate generally to semiconductor integrated circuits, and more particularly to transmitters and receivers for low power input/output, and memory systems including the transmitters and the receivers.

DISCUSSION OF RELATED ART

Memory-intensive applications may use memory bandwidth for high performance computing (HPC), such as for artificial intelligence (AI) and/or a graphics processing unit (GPU). The enlargement of the bandwidth may rely on innovations in process technology. Developments in the process technology have been creating higher density in integrated circuits (ICs). A three-dimensional (3D) integration provides a possibility to continue enlarging the density of ICs.

A high bandwidth memory (HBM) using a through-silicon via (TSV) has been researched. If a plurality of TSVs are used as channels, a signal transition on one channel might be propagated or transferred to an adjacent channel as noise due to parasitic capacitance formed by material characteristics of the TSVs. Due to the noise, data may be delayed or jitter may be added, and thus performance of a receiver may be degraded.

SUMMARY

At least one embodiment of the present disclosure provides a transmitter that generates a duobinary data signal using a time-interleaved scheme for low power input/output.

At least one embodiment of the present disclosure provides a receiver that receives a duobinary data signal.

At least one embodiment of the present disclosure provides a memory system that includes the transmitter and the receiver.

According to an embodiment, a transmitter includes: a multiplexer configured to generate a plurality of time-interleaved data signals based on a plurality of input data signals and multi-phase clock signals, the plurality of input data signals being input in parallel, each of the plurality of input data signals having at least two voltage levels that are different from each other; control logic configured to generate a plurality of control signals based on the plurality of time-interleaved data signals, at least one of the plurality of control signals having a voltage level that is temporarily boosted; and a voltage mode driver configured to generate an output data signal based on the plurality of control signals, the output data signal having at least three voltage levels that are different from each other.

According to an embodiment, a transmitter includes a multiplexer, control logic and a voltage mode driver. The multiplexer generates a plurality of time-interleaved data signals based on a plurality of input data signals and multi-phase clock signals. The plurality of input data signals are input in parallel. Each of the plurality of input data signals is a binary signal and has two voltage levels that are different from each other. The control logic generates at least one pull-down control signal and a plurality of pull-up control signals based on the plurality of time-interleaved data signals. Each of the plurality of pull-up control signals has a voltage level that is temporarily boosted. The voltage mode driver generates an output data signal based on the at least one pull-down control signal and the plurality of pull-up control signals. The output data signal is a duobinary signal and has three voltage levels that are different from each other.

According to an embodiment, a receiver includes: a first flip-flop configured to receive an input data signal having at least three voltage levels that are different from each other, a first clock signal, a first reference voltage and a first selection signal, form a second reference voltage different from the first reference voltage based on the first reference voltage and the first selection signal, generate a first output data signal based thereon, the first output data signal being a signal having at least two voltage levels that are different from each other, and provide the first output data signal as a second selection signal; and a second flip-flop configured to receive the input data signal, a second clock signal different from the first clock signal, the first reference voltage and the second selection signal, generate a second output data signal based thereon, the second output data signal being a signal having at least two voltage levels that are different from each other, and provide the second output data signal as the first selection signal.

According to an embodiment, a receiver includes a first flip-flop and a second flip-flop. The first flip-flop receives an input data signal, and generates a first output data signal based on the input data signal, a first clock signal, a first reference voltage and a first selection signal. The input data signal is a duobinary signal and has three voltage levels that are different from each other. The first output data signal is a binary signal and has two voltage levels that are different from each other. The second flip-flop receives the input data signal, and generates a second output data signal based on the input data signal, a second clock signal, the first reference voltage and a second selection signal. The second output data signal is the binary signal and has the two voltage levels that are different from each other. The second clock signal is different from the first clock signal. The second output data signal is provided as the first selection signal, and the first output data signal is provided as the second selection signal. A second reference voltage different from the first reference voltage is formed in the first flip-flop based on the first reference voltage and the first selection signal.

According to an embodiment, a memory system includes: a transmitter configured to output write data to be stored in a memory device or read data retrieved from the memory device; a channel configured to transmit the write data or the read data; and a receiver configured to receive the write data or the read data, wherein the transmitter includes: a multiplexer configured to generate a plurality of time-interleaved data signals based on a plurality of input data signals and multi-phase clock signals, the plurality of input data signals being input in parallel, each of the plurality of input data signals having at least two voltage levels that are different from each other; control logic configured to generate a plurality of control signals based on the plurality of time-interleaved data signals, at least one of the plurality of control signals having a voltage level that is temporarily boosted; and a voltage mode driver configured to generate an output data signal based on the at least one pull-down control signal and the plurality of pull-up control signals, the output data signal having at least three voltage levels that are different from each other, wherein the receiver includes: a first flip-flop configured to receive the output data signal, a first clock signal, a first reference voltage and a first selection signal, form a second reference voltage different from the first reference voltage based on the first reference voltage and the first selection signal, generate a first data signal based thereon, the first data signal being at least one of the plurality of input data signals having at least two voltage levels that are different from each other, and provide the first data signal as a second selection signal; and a second flip-flop configured to receive the output data signal, a second clock signal, the first reference voltage and the second selection signal, generate a second data signal based thereon, the second data signal being at least one of the plurality of input data signals having at least two voltage levels that are different from each other, the second clock signal being different from the first clock signal, and to provide the second data signal as the first selection signal, wherein the plurality of input data signals, the output data signal and the first and second data signals correspond to the write data or the read data.

According to an embodiment, a memory system includes a transmitter, a channel and a receiver. The transmitter outputs write data to be stored in a memory device or read data retrieved from the memory device. The channel transmits the write data or the read data. The receiver receives the write data or the read data. The transmitter includes a multiplexer, control logic and a voltage mode driver. The multiplexer generates a plurality of time-interleaved data signals based on a plurality of input data signals and multi-phase clock signals. The plurality of input data signals are input in parallel. Each of the plurality of input data signals is a binary signal and has two voltage levels that are different from each other. The control logic generates at least one pull-down control signal and a plurality of pull-up control signals based on the plurality of time-interleaved data signals. Each of the plurality of pull-up control signals has a voltage level that is temporarily boosted. The voltage mode driver generates an output data signal based on the at least one pull-down control signal and the plurality of pull-up control signals. The output data signal is a duobinary signal and has three voltage levels that are different from each other. The receiver includes a first flip-flop and a second flip-flop. The first flip-flop receives the output data signal, and generates a first data signal based on the output data signal, a first clock signal, a first reference voltage and a first selection signal. The first data signal is the binary signal. The second flip-flop receives the output data signal, and generates a second data signal based on the output data signal, a second clock signal, the first reference voltage and a second selection signal. The second data signal is the binary signal. The second clock signal is different from the first clock signal. The second data signal is provided as the first selection signal, and the first data signal is provided as the second selection signal. A second reference voltage different from the first reference voltage is formed in the first flip-flop based on the first reference voltage and the first selection signal. The plurality of input data signals, the output data signal and the first and second data signals correspond to the write data or the read data.

The transmitter and the receiver according to an embodiment may have a structure for low power input/output. For example, the transmitter may generate the output data signal that is the duobinary signal based on a time-interleaved scheme, may have a structure for minimizing or reducing the static power consumption, and may have a structure for increasing the operation speed and power efficiency. For example, the receiver may have an optimized structure by reducing the number of reference voltages for sensing the input data signal that is the duobinary signal, may have a structure for enhancing the input offset, and may have a structure for reducing the output delay variation.

The memory system according to an embodiment that includes the transmitter and/or the receiver according to an embodiment may exhibit enhanced signal characteristics.

BRIEF DESCRIPTION OF THE DRAWINGS

Illustrative, non-limiting embodiments will be more clearly understood from the following detailed description taken in conjunction with the accompanying drawings.

FIGS. 4A, 4B, 4C, 4D and 4E are signal diagrams illustrating an example of signals that are input to or output from a transmitter of FIG. 3.

DETAILED DESCRIPTION

Figure 1:
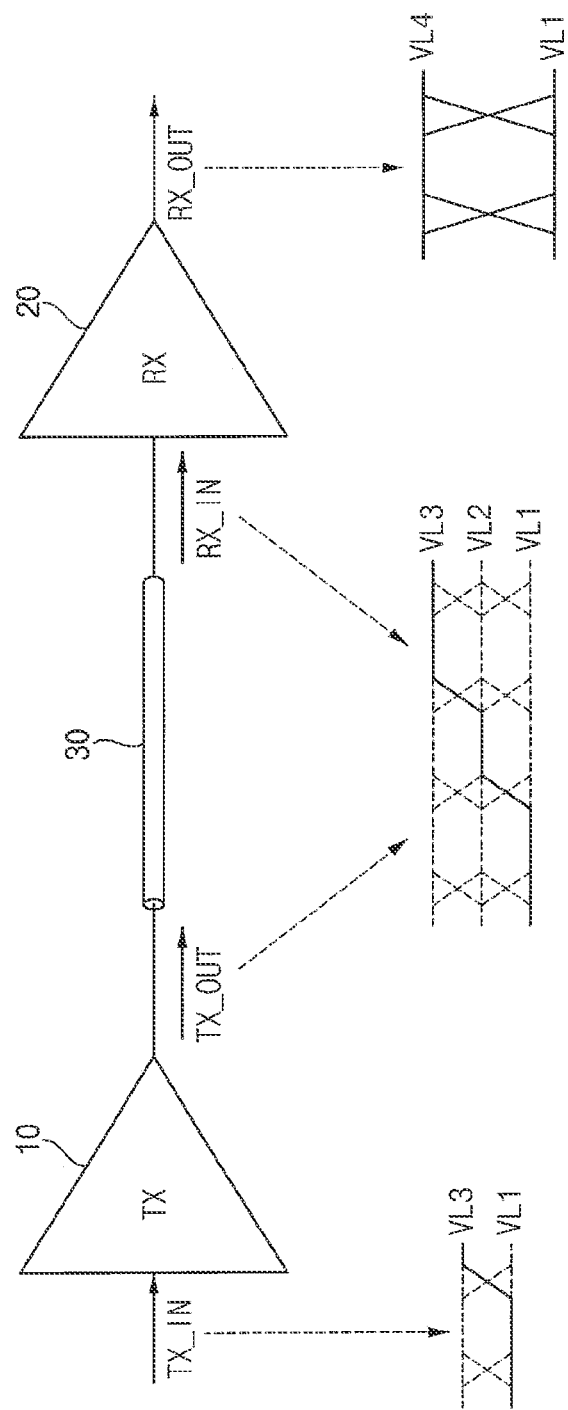
FIG. 1 is a block diagram illustrating a transmitter and a receiver according to an embodiment.

Various embodiments will be described more fully with reference to the accompanying drawings, in which embodiments are shown. The present disclosure may, however, be embodied in many different forms and should not be construed as limited to the embodiments set forth herein. Like reference numerals may refer to like elements throughout this application.

FIG. 1 illustrates a transmitter and a receiver according to an embodiment.

Referring to FIG. 1, a transmitter (TX) 10 and a receiver (RX) 20 are connected to each other through a channel 30.

For example, as will be described with reference to FIGS. 14A and 14B, the channel 30 may include at least one through silicon via (TSV).

The transmitter 10 generates an output data signal TX_OUT based on an input data signal TX_IN. The output data signal TX_OUT is transmitted to the receiver 20 through the channel 30. The receiver 20 generates an output data signal RX_OUT based on an input data signal RX_IN. Each of the input data signal TX_IN and the output data signal RX_OUT may be implemented or formed based on a binary scheme, and may be referred to as a binary signal. Each of the output data signal TX_OUT and the input data signal RX_IN may be implemented or formed based on a duobinary scheme, and may be referred to as a duobinary signal.

In the duobinary scheme, a data signal may have three voltage levels that are different from each other. For example, each of the output data signal TX_OUT and the input data signal RX_IN may have one of the three voltage levels during one unit interval (UI). The duobinary signal may also be referred to as a three-level signal and/or a multi-level signal. For example, one value (or data) included in the output data signal TX_OUT that is the duobinary signal may represent the sum of two adjacent values (or bits) included in the input data signal TX_IN (e.g., the sum of a previous value and a current value).

For example, the three voltage levels of the output data signal TX_OUT may include a first voltage level VL1, a second voltage level VL2 higher than the first voltage level VL1, and a third voltage level VL3 higher than the second voltage level VL2. The first voltage level VL1, the second voltage level VL2 and the third voltage level VL3 may be referred to as a low level, a middle (or mid) level and a high level, respectively. For example, the first voltage level VL1 may be about 0V, the second voltage level VL2 may be about 0.3V, and the third voltage level VL3 may be about 0.6V.

In the binary scheme, a data signal may have two voltage levels that are different from each other. For example, each of the input data signal TX_IN and the output data signal RX_OUT may have one of the two voltage levels during one unit interval. The binary signal may also be referred to as a two-level signal. For example, one value (or data) included in the output data signal RX_OUT that is the binary signal may represent one value (or bit) included in the input data signal TX_IN.

For example, the two voltage levels of the output data signal RX_OUT may include the first voltage level VL1 without limitation thereto, and a fourth voltage level VL4 higher than the first voltage level VL1. The first voltage level VL1 and the fourth voltage level VL4 may be referred to as a low level and a high level, respectively. For example, the fourth voltage level VL4 may be higher than the third voltage level VL3, and may be about 1.2V. In other words, a swing width (e.g., a voltage difference between the low and high levels) of the output data signal RX_OUT may be greater than a swing width of the output data signal TX_OUT.

For example, the input data signal TX_IN that is the binary signal may also have two voltage levels that are different from each other. For example, a low level of the input data signal TX_IN may be substantially equal to the first voltage level VL1 without limitation thereto, and a high level of the input data signal TX_IN may be substantially equal to the third voltage level VL3 without limitation thereto.

The transmitter 10 and the receiver 20 according to an embodiment may have a structure for low power input/output. For example, the transmitter 10 may generate the output data signal TX_OUT that is the duobinary signal based on a time-interleaved scheme, may have a structure for minimizing or reducing the static power consumption, and may have a structure for increasing the operation speed and power efficiency. For example, the receiver 20 may have a structure for reducing the number of reference voltages for sensing the input data signal RX_IN that is the duobinary signal, may have a structure for enhancing the input offset, and may have a structure for reducing the output delay variation. Detailed configurations and operations of the transmitter 10 will be described with reference to FIGS. 2, 3, 4A, 4B, 4C, 4D, 4E, 5, 6, 7A, 7B, 7C and 7D. Detailed configurations and operations of the receiver 20 will be described with reference to FIGS. 8, 9, 10A, 10B, 11A and 11B.

Figure 2:
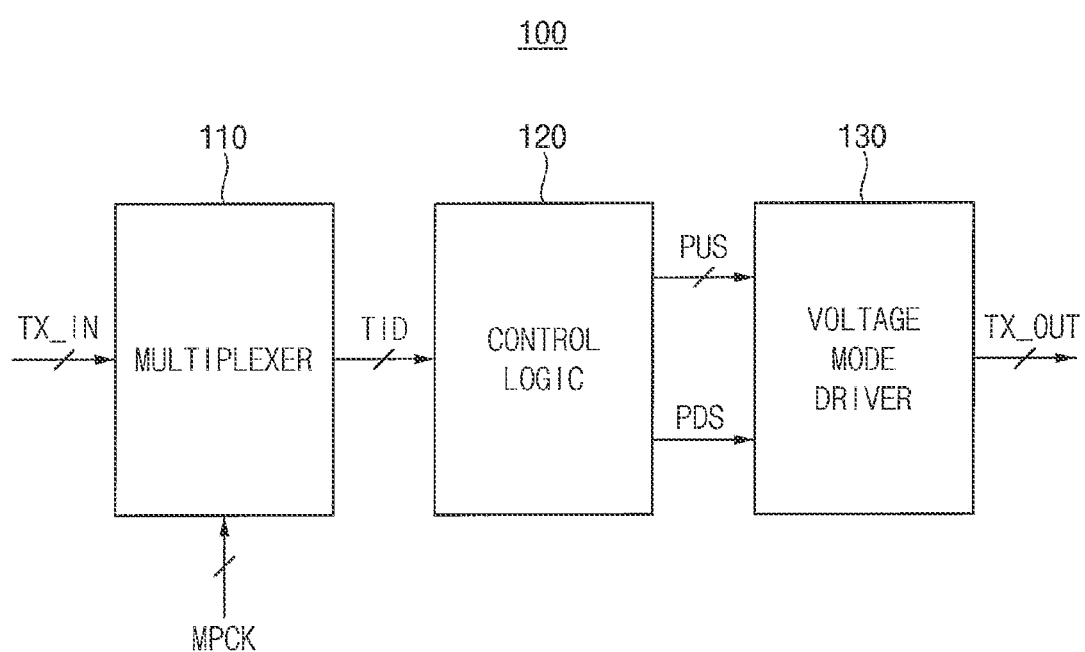
FIG. 2 is a block diagram illustrating a transmitter according to an embodiment.

FIG. 2 illustrates a transmitter according to an embodiment.

Referring to FIG. 2, a transmitter 100 includes a multiplexer 110, control logic 120 and a voltage mode driver 130.

The multiplexer 110 may generate a plurality of time-interleaved data signals TID based on a plurality of input data signals TX_IN and multi-phase clock signals MPCK. The plurality of input data signals TX_IN may be input in parallel. As described with reference to FIG. 1, each of the plurality of input data signals TX_IN is a binary signal and has two voltage levels that are different from each other. The multi-phase clock signals MPCK may include clock signals of which phases partially overlap. The multiplexer 110 may serialize the plurality of input data signals TX_IN.

For example, the number of the plurality of input data signals TX_IN and the number of the clock signals included in the multi-phase clock signals MPCK may be substantially equal to each other, and one clock signal may correspond to one input data signal. In addition, one time-interleaved data signal may be generated by temporally interleaving two or more input data signals, and thus the number of the plurality of time-interleaved data signals TID may be less than the number of the plurality of input data signals TX_IN.

The control logic 120 may generate at least one pull-down control signal PDS and a plurality of pull-up control signals PUS based on the plurality of time-interleaved data signals TID. Each of the plurality of pull-up control signals PUS has a voltage level that is temporarily boosted. Since the transmitter 100 operates or is driven based on the pull-up control signals PUS having the voltage level that is temporarily boosted, a transition of the output data signal TX_OUT may be reinforced, and thus the operation speed and power efficiency of the transmitter 100 may be increased. In an alternate embodiment, the control logic 120 may generate at least one pull-up control signal PUS and a plurality of pull-down control signals PDS based on the plurality of time-interleaved data signals TID.

The voltage mode driver 130 generates an output data signal TX_OUT based on the at least one pull-down control signal PDS and the plurality of pull-up control signals PUS. As described with reference to FIG. 1, the output data signal TX_OUT is a duobinary signal and has three voltage levels that are different from each other. For example, as will be described with reference to FIG. 3, the voltage mode driver 130 may be a dual source driver. In an alternate embodiment, the duobinary signal may have more than three voltage levels that are different from each other.

The transmitter 100 according to an embodiment may include the voltage mode driver 130 having relatively low static power consumption instead of a current mode logic (CML) driver or current mode driver having a relatively high static power consumption. The transmitter 100 according to an embodiment may include the control logic 120 used to generate the duobinary signal (e.g., a three-level signal) for the voltage mode driver 130.

Figure 3:
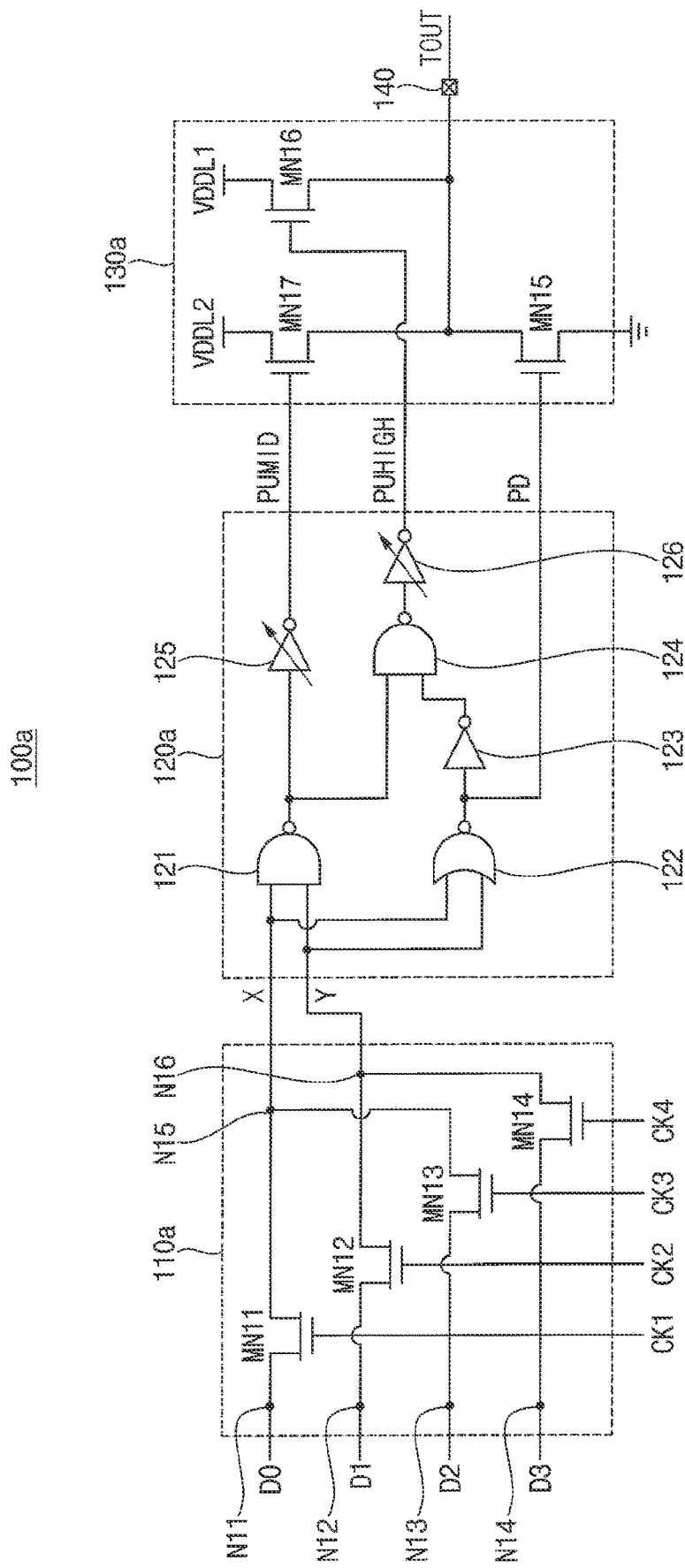
FIG. 3 is a circuit diagram illustrating an example of a transmitter of FIG. 2.

FIG. 3 illustrates an example of a transmitter of FIG. 2. FIGS. 4A, 4B, 4C, 4D and 4E illustrate examples of signals that are input to or output from a transmitter of FIG. 3.

Referring to FIGS. 3, 4A, 4B, 4C, 4D and 4E, a transmitter 100a includes a multiplexer 110a, control logic 120a and a voltage mode driver 130a. The transmitter 100a may further include an output node or an output terminal 140.

In an operating example of FIG. 3, the plurality of input data signals TX_IN in FIG. 2 may include a first input data signal D0, a second input data signal D1, a third input data signal D2, and a fourth input data signal D3 that are input in parallel. The multi-phase clock signals MPCK in FIG. 2 may include a first clock signal CK1, a second clock signal CK2, a third clock signal CK3 and a fourth clock signal CK4 of which phases partially overlap. The plurality of time-interleaved data signals TID in FIG. 2 may include a first time-interleaved data signal X and a second time-interleaved data signal Y. The at least one pull-down control signal PDS in FIG. 2 may include a first pull-down control signal PD. The plurality of pull-up control signals PUS in FIG. 2 may include a first pull-up control signal PUMID and a second pull-up control signal PUHIGH. The output data signal TX_OUT in FIG. 2 may correspond to an output data signal TOUT in FIG. 3.

The multiplexer 110a may include a first transistor MN11, a second transistor MN12, a third transistor MN13 and a fourth transistor MN14. The first transistor MN11 may be connected between a first input node N11 receiving the first input data signal D0 and a first output node N15 providing the first time-interleaved data signal X, and may have a gate electrode receiving the first clock signal CK1. The second transistor MN12 may be connected between a second input node N12 receiving the second input data signal D1 and a second output node N16 providing the second time-interleaved data signal Y, and may have a gate electrode receiving the second clock signal CK2. The third transistor MN13 may be connected between a third input node N13 receiving the third input data signal D2 and the first output node N15, and may have a gate electrode receiving the third clock signal CK3. The fourth transistor MN14 may be connected between a fourth input node N14 receiving the fourth input data signal D3 and the second output node N16, and may have a gate electrode receiving the fourth clock signal CK4.

Figure 4A:
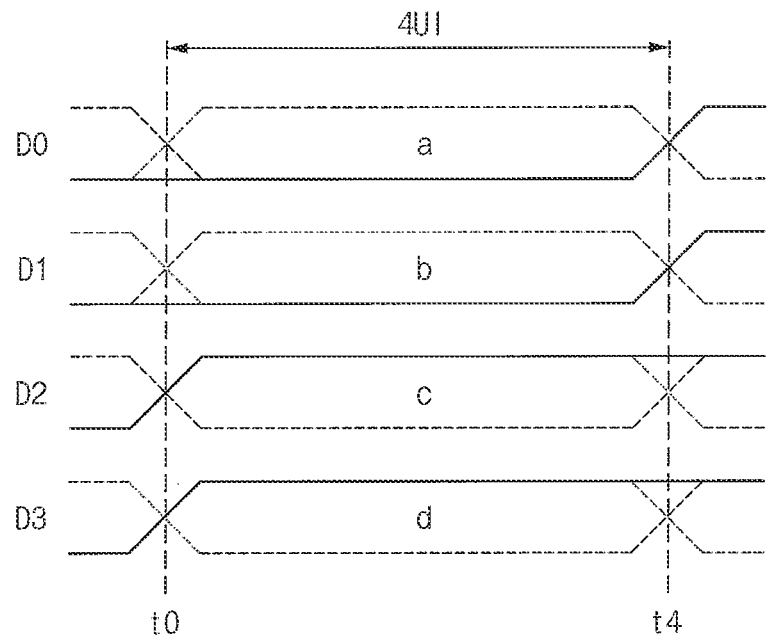
Figure 4B:
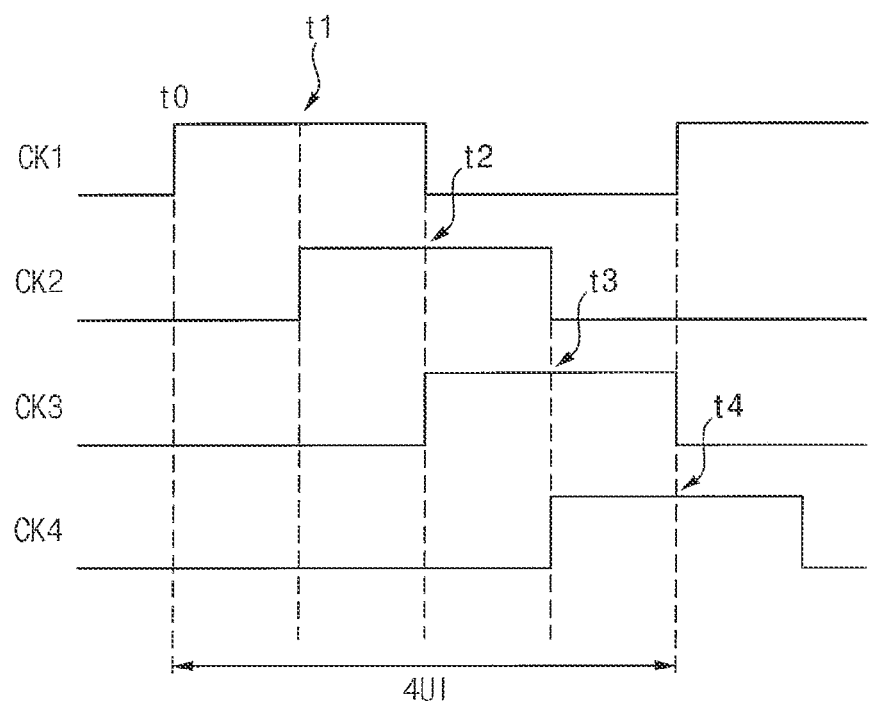
Figure 4E:
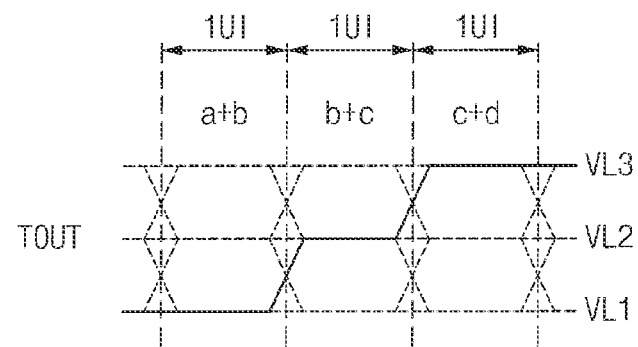

When a time interval for representing one value in the output data signal TOUT is defined as one unit interval (1 UI) as illustrated in FIG. 4E, a time interval for representing one value in each of the first, second, third and fourth input data signals D0, D1, D2 and D3 may correspond to four unit intervals (4 UI) as illustrated in FIG. 4A, and a period of each of the first, second, third and fourth clock signals CK1, CK2, CK3 and CK4 may correspond to four unit intervals as illustrated in FIG. 4B. For example, a first data rate of the first, second, third and fourth input data signals D0, D1, D2 and D3 may be about 1 Gb/s, and a frequency of the first, second, third and fourth clock signals CK1, CK2, CK3 and CK4 may be about 0.5 GHz. The first, second, third and fourth input data signals D0, D1, D2, D3 may have values of "a", "b", "c" and "d", respectively. For example, "a" and "b" may be "0", respectively, and "c" and "d" may be "1", respectively.

As described above, the multiplexer 110a may serialize the first, second, third and fourth input data signals D0, D1, D2 and D3, and may output the first and second time-interleaved data signals X and Y by temporally interleaving the first, second, third and fourth input data signals D0, D1, D2 and D3. For example, the first time-interleaved data signal X may be generated by temporally interleaving the first and third input data signals D0 and D2, and the second time-interleaved data signal Y may be generated by temporally interleaving the second and fourth input data signals D1 and D3. A second data rate of the first and second time-interleaved data signals X and Y may be higher than the first data rate. For example, the second data rate may be about twice the first data rate, and may be about 2 Gb/s.

For example, as illustrated in FIGS. 4A, 4B and 4C, at time t1, the first input data signal D0 may be output as the first time-interleaved data signal X based on the first clock signal CK1, the first time-interleaved data signal X may have a value of "0" corresponding to the first input data signal D0, and the second time-interleaved data signal Y may have a value of "0" that is an initial value. At time t2, the second input data signal D1 may be output as the second time-interleaved data signal Y based on the second clock signal CK2, the second time-interleaved data signal Y may have a value of "0" corresponding to the second input data signal D1, and the first time-interleaved data signal X may have a value of "0" in which the value at time t1 is maintained. Similarly, at time t3, the third input data signal D2 may be output as the first time-interleaved data signal X based on the third clock signal CK3, the first time-interleaved data signal X may have a value of "1" corresponding to the third input data signal D2, and the second time-interleaved data signal Y may have a value of "0" in which the value at time t2 is maintained. At time t4, the fourth input data signal D3 may be output as the second time-interleaved data signal Y based on the fourth clock signal CK4, the second time-interleaved data signal Y may have a value of "1" corresponding to the fourth input data signal D3, and the first time-interleaved data signal X may have a value of "1" in which the value at time t3 is maintained.

The control logic 120a may include a first NAND gate 121, a NOR gate 122, an inverter 123, a second NAND gate 124, a first boosting circuit 125 and a second boosting circuit 126.

The first NAND gate 121 may perform a NAND operation on the first and second time-interleaved data signals X and Y. The NOR gate 122 may generate the first pull-down control signal PD by performing a NOR operation on the first and second time-interleaved data signals X and Y. The inverter 123 may invert an output of the NOR gate 122 (e.g., may invert the first pull-down control signal PD). The second NAND gate 124 may perform a NAND operation on an output of the first NAND gate 121 and an output of the inverter 123. The first boosting circuit 125 may generate the first pull-up control signal PUMID having a temporarily-boosted voltage level based on the output of the first NAND gate 121. The second boosting circuit 126 may generate the second pull-up control signal PUHIGH having a temporarily-boosted voltage level based on an output of the second NAND gate 124.

A value of the first pull-down control signal PD and values of the first and second pull-up control signals PUMID and PUHIGH may be determined based on the values of the first and second time-interleaved data signals X and Y. A third data rate of the first pull-down control signal PD and the first and second pull-up control signals PUMID and PUHIGH may be higher than the second data rate. For example, the third data rate may be about twice the second data rate, and may be about 4 Gb/s.

For example, as illustrated in FIGS. 4C and 4D, when the first and second time-interleaved data signals X and Y have the value of "0" at times t1 and t2, the first pull-down control signal PD may have a value of "1", and the first and second pull-up control signals PUMID and PUHIGH may have a value of "0". When the first time-interleaved data signal X has the value of "1" and the second time-interleaved data signal Y has the value of "0" at time t3, the first pull-up control signal PUMID may have a value of "1", and the first pull-down control signal PD and the second pull-up control signal PUHIGH may have a value of "0". When the first and second time-interleaved data signals X and Y have the value of "1" at time t4, the second pull-up control signal PUHIGH may have a value of "1", and the first pull-down control signal PD and the first pull-up control signal PUMID may have a value of "0". The asterisk (*) indicated in front of the value of "1" of the first pull-up control signal PUMID at time t3 and in front of the value of "1" the second pull-up control signal PUHIGH at time t4 may represent that the first and second pull-up control signals PUMID and PUHIGH have a boosted high level.

The voltage mode driver 130a may include a first transistor MN15, a second transistor MN16 and a third transistor MN17.

The first transistor MN15 may be connected between the output node 140 providing the output data signal TOUT and a ground voltage having the first voltage level VL1, and may have a gate electrode receiving the first pull-down control signal PD. The second transistor MN16 may be connected between a first power supply voltage VDDL1 having the third voltage level VL3 and the output node 140, and may have a gate electrode receiving the second pull-up control signal PUHIGH. The third transistor MN17 may be connected between a second power supply voltage VDDL2 having the second voltage level VL2 and the output node 140, and may have a gate electrode receiving the first pull-up control signal PUMID. For example, the second voltage level VL2 may be about a half of the third voltage level VL3 (e.g., 2*VL2=VL3 or 2*VDDL2=VDDL1). For example, the first transistor MN15 may be a pull-down transistor, and each of the second and third transistors MN16 and MN17 may be a pull-up transistor.

The output data signal TOUT may have a voltage level corresponding to the sum of two adjacent input data signals among the first, second, third and fourth input data signals D0, D1, D2 and D3. For example, one of the first, second and third transistors MN15, MN16 and MN17 may be turned on based on the value of the first pull-down control signal PD and the values of the first and second pull-up control signals PUMID and PUHIGH, and the voltage level of the output data signal TOUT may be determined based on the turned-on transistor. The output data signal TOUT may have the third data rate.

For example, as illustrated in FIGS. 4C, 4D and 4E, when the first pull-down control signal PD has the value of "1" at time t2, the first transistor MN15 may be turned on, and the output data signal TOUT may have the first voltage level VL1 based on the ground voltage. The first voltage level VL1 may correspond to a value of "a+b" (e.g., "0"), which is the sum of the first and second input data signals D0 and D1. Similarly, when the first pull-up control signal PUMID has the value of "1" at time t3, the third transistor MN17 may be turned on, and the output data signal TOUT may have the second voltage level VL2 based on the second power supply voltage VDDL2. The second voltage level VL2 may correspond to a value of "b+c" (e.g., "1"), which is the sum of the second and third input data signals D1 and D2. When the second pull-up control signal PUHIGH has the value of "1" at time t4, the second transistor MN16 may be turned on, and the output data signal TOUT may have the third voltage level VL3 based on the first power supply voltage VDDL1. The third voltage level VL3 may correspond to a value of "c+d" (e.g., "2"), which is the sum of the third and fourth input data signals D2 and D3. Although not illustrated in FIG. 4E, at time t1, the first transistor MN15 may be turned on as with at time t2, and the output data signal TOUT may have the first voltage level VL1.

In an embodiment, each of the transistors MN11, MN12, MN13, MN14, MN15, MN16 and MN17 may be an n-type metal oxide semiconductor (NMOS) transistor.

Figure 5:
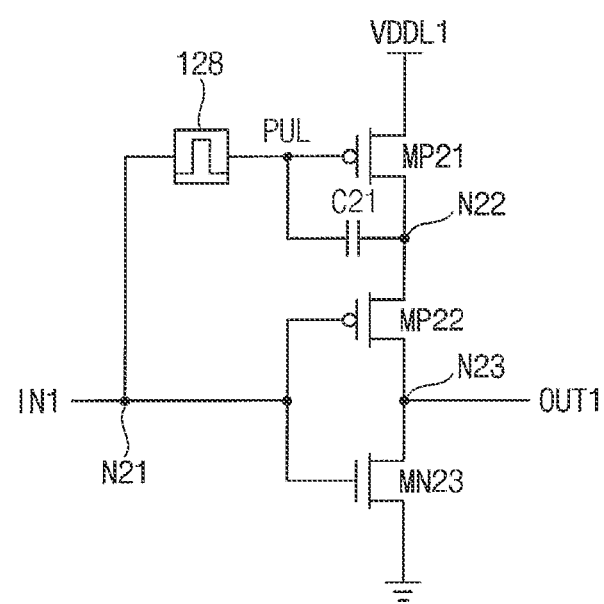
FIG. 5 is a circuit diagram illustrating an example of a first boosting circuit included in a transmitter of FIG. 3.
Figure 6:
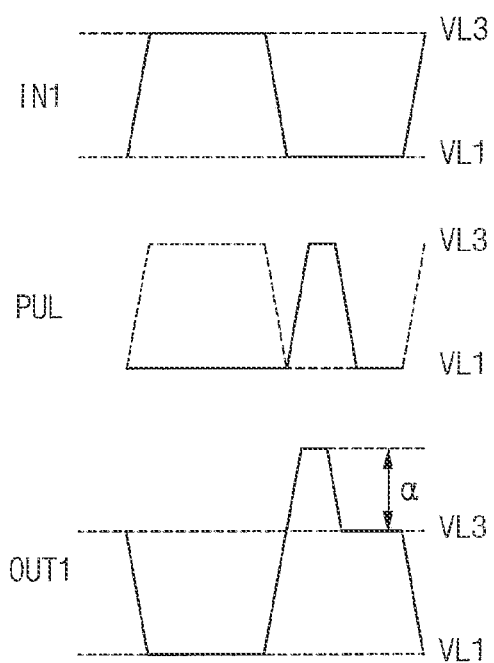
FIG. 6 is a signal diagram illustrating an example of signals that are input to or output from a first boosting circuit of FIG. 5.

FIG. 5 is a circuit diagram illustrating an example of a first boosting circuit included in a transmitter of FIG. 3. FIG. 6 is a diagram illustrating an example of signals that are input to or output from a first boosting circuit of FIG. 5.

Referring to FIGS. 5 and 6, the first boosting circuit 125 may include a pulse generator 128, a first transistor MP21, a capacitor C21, a second transistor MP22 and a third transistor MN23.

The pulse generator 128 may be connected to an input node N21 receiving the output of the first NAND gate 121, and may generate a pulse signal PUL based on the output of the first NAND gate 121, such as when the output of the first NAND gate 121 transitions from a high voltage level such as VL3 to a low voltage level such as VL1. The first transistor MP21 may be connected between the first power supply voltage VDDL1 and a node N22, and may have a gate electrode receiving the pulse signal PUL. The capacitor C21 may be connected between the gate electrode of the first transistor MP21 and the node N22. The second transistor MP22 may be connected between the node N22 and an output node N23 providing the first pull-up control signal PUMID, and may have a gate electrode connected to the input node N21. The third transistor MN23 may be connected between the output node N23 and the ground voltage, and may have a gate electrode connected to the input node N21.

In an embodiment, each of the transistors MP21 and MP22 may be a p-type metal oxide semiconductor (PMOS) transistor, and the transistor MN23 may be an NMOS transistor.

The control logic 120a included in the transmitter 100a according to an embodiment may include the pulse generator 128 for generating a delay for a predetermined time interval so that the operation speed and power efficiency of the transmitter 100a are increased. A level of the pulse signal PUL and a level of the first pull-up control signal PUMID provided through the output node N23 may be determined based on the output of the first NAND gate 121 received from the input node N21.

For example, in FIG. 6, "IN1" represents the output of the first NAND gate 121 such as X NAND Y, e.g., a voltage at the input node N21, and "OUT1" represents the first pull-up control signal PUMID provided through the output node N23, e.g., a voltage at the output node N23. When the voltage IN1 at the input node N21 has a high level (e.g., the third voltage level VL3 or "1"), each of the pulse signal PUL and the voltage OUT1 at the output node N23 may have a low level (e.g., the first voltage level VL1 or "0"). When both the pulse signal PUL and the voltage OUT1 at the output node N23 have the low level, the first transistor MP21, which is referred to as a header PMOS transistor, may be turned on to have a precharge time sufficiently, and the capacitor C21 may be precharged based on the first power supply voltage VDDL1. After that, when the voltage IN1 at the input node N21 is transitioned from a high level to a low level, the pulse signal PUL may be transitioned from a low level to a high level, may maintain the high level for a predetermined time interval, and then may be transitioned from the high level to the low level again. During the predetermined time interval during which the pulse signal PUL has the high level, the first transistor MP21 may be turned off, and the output node N23 may be boosted and the voltage OUT1 at the output node N23 may have the boosted high level (e.g., a voltage level of "VL3+α"), based on charges precharged in the capacitor C21. When the pulse signal PUL has the low level after the predetermined time interval during which the pulse signal PUL has the high level, the first transistor MP21 may be turned on, and the output node N23 may return to a previous state and the voltage OUT1 at the output node N23 may have an original high level (e.g., the third voltage level VL3). As a result, the first pull-up control signal PUMID may have the temporarily-boosted voltage level, such as the voltage OUT1 at the output node N23 illustrated in FIG. 6.

Although alternate embodiments may differ, configurations and operations of the second boosting circuit 126 may be substantially the same as those of the first boosting circuit 125 described with reference to FIGS. 5 and 6. Duplicate description may be omitted.

In the voltage mode driver 130a that is the final stage, the transition from the first voltage level VL1 to the second voltage level VL2 and the transition from the second voltage level VL2 to the third voltage level VL3 may be reinforced based on the outputs (e.g., the first and second pull-up control signals PUMID and PUHIGH) of the control logic 120a that are temporarily boosted to the voltage level of "VL3+α". In other words, the pull-up transistors in the output driver may be temporarily more strongly driven. In addition, the operation region may be guaranteed to be a linear region by the boosted high level even if the transition from the second voltage level VL2 to the third voltage level VL3 occurs, and thus the voltage mode driver 130a may reliably operate even in the presence of process-voltage-temperature (PVT) variations or the like.

FIGS. 7A, 7B, 7C and 7D illustrate performance of a transmitter of FIG. 3. In particular, FIGS. 7A, 7B, 7C and 7D illustrate simulation results for the transmitter of FIG. 3.

Figure 7A:
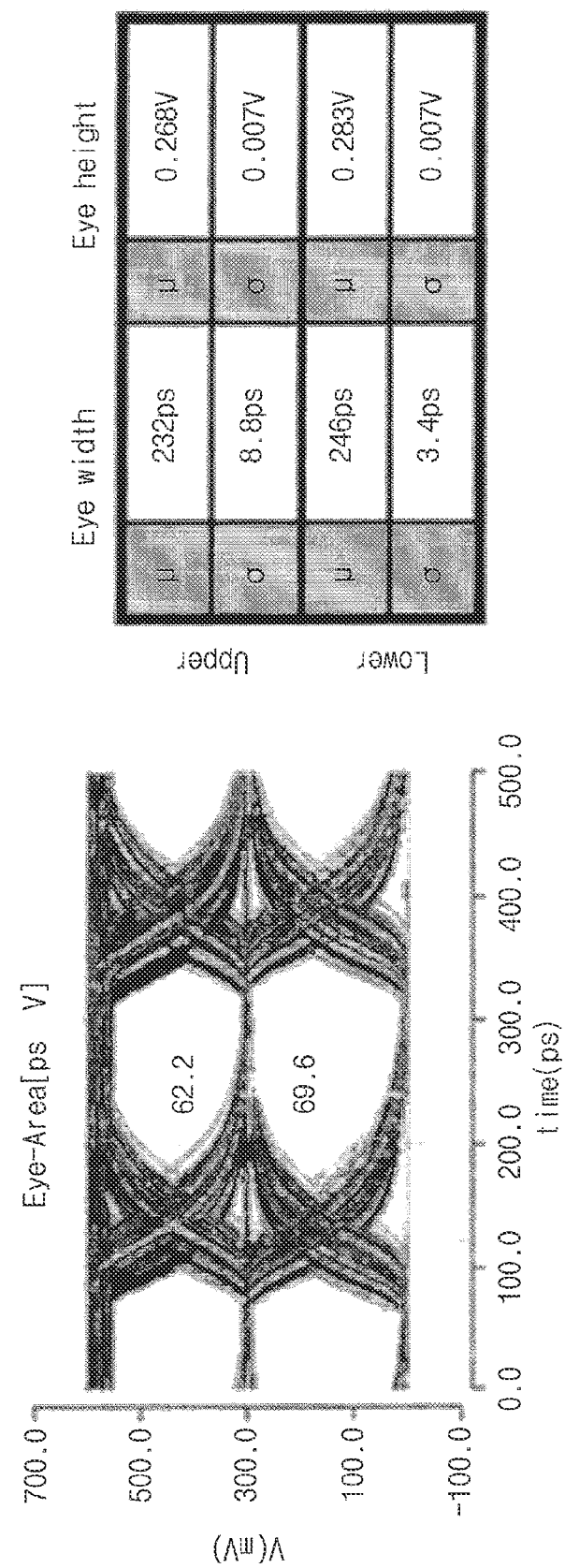
FIGS. 7A, 7B, 7C and 7D are signal diagrams illustrating performance of a transmitter of FIG. 3.

Referring to FIG. 7A, results of performing a Monte Carlo simulation over about 1000 simulation runs are illustrated for the transmitter 100a according to an example under theoretically ideal conditions (e.g., VDD, TT corner, and room temperature). The transmitter 100a operates with sufficient margins as shown by a sufficient eye-area including eye width and eye height of the illustrated lower opening corresponding to the transition from the first voltage level VL1 to the second voltage level VL2, and a sufficient eye-area including eye width and eye height of the illustrated upper opening corresponding to the transition from the second voltage level VL2 to the third voltage level VL3.

Figure 7B:
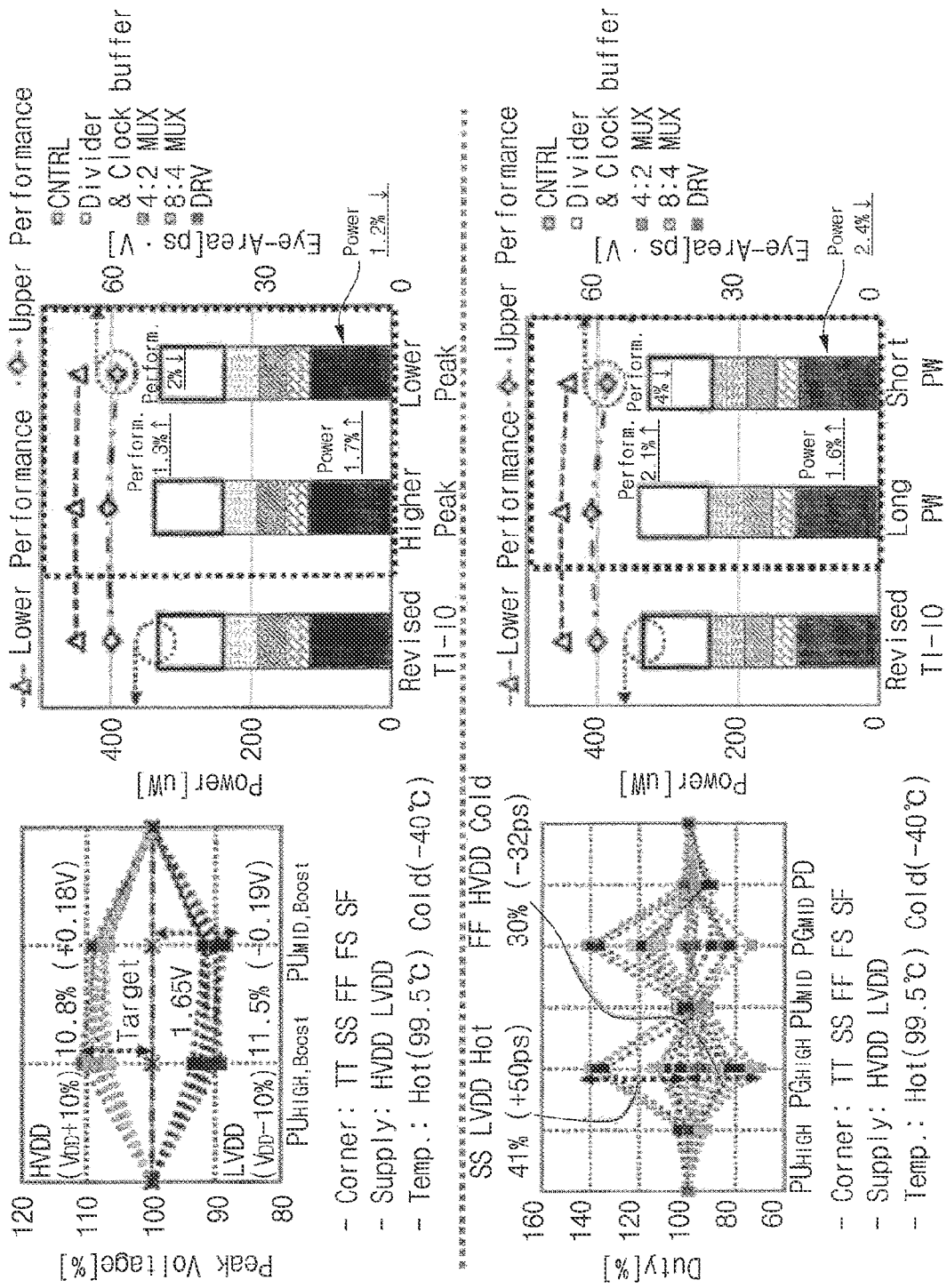

Referring to FIG. 7B, changes are illustrated in the boosted high level and the boosting time of the outputs of the control logic 120a included in the transmitter 100a according to embodiments depending on the PVT variation. The boosted high level may be referred to as a peak voltage, and the boosting time may be referred to as a duty or a time interval during which the boosted high level is maintained. It may be seen that changes in the eye performance and power are within about ±2% even if the boosted high level fluctuates by about ±10%. In addition, it may be seen that the overall performance change is within about 4% even if the boosting time varies up to about 40%.

Figure 7C:
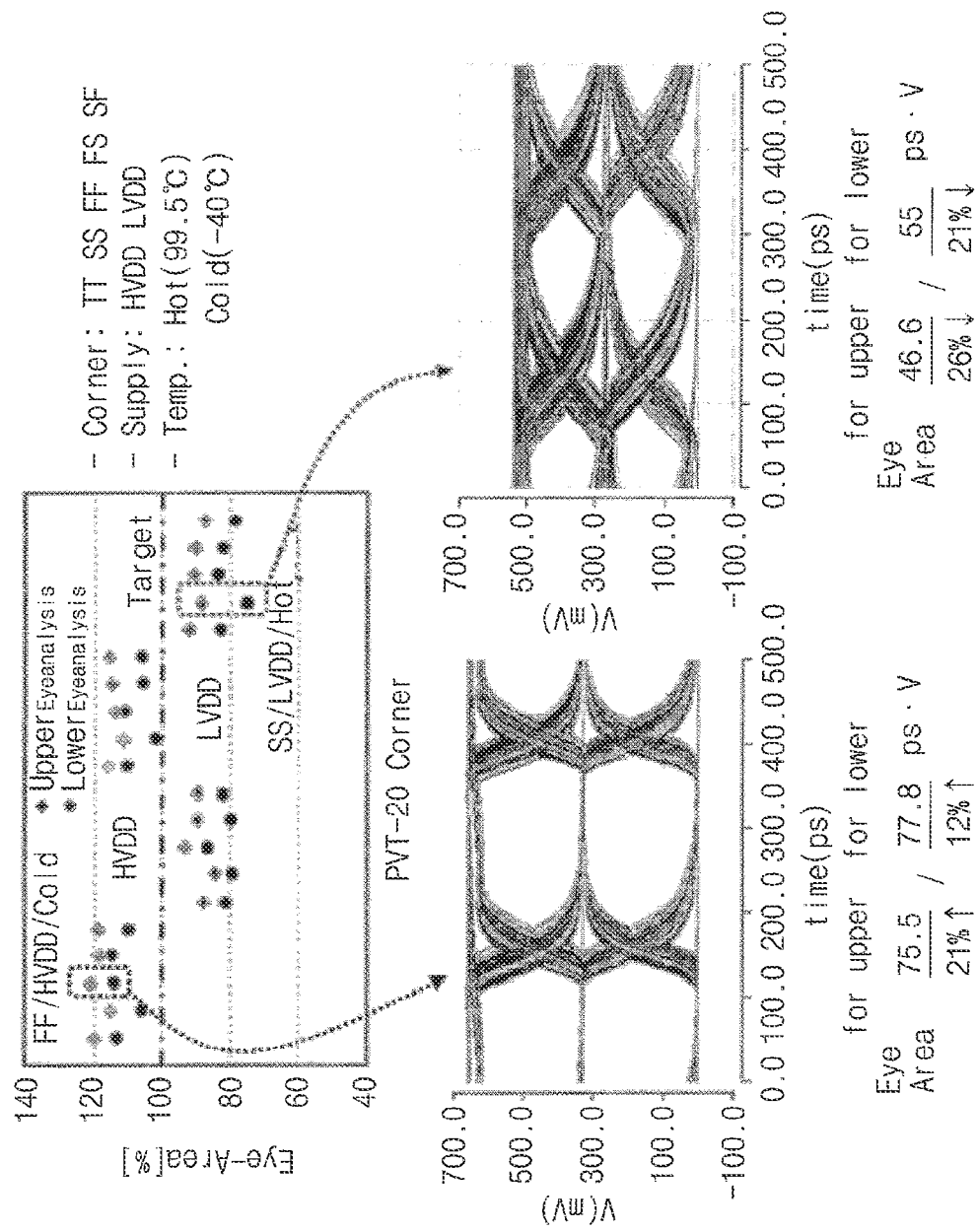

Referring to FIG. 7C, results of analyzing the eye performance in 20 corners (e.g., a process corner: TT, SS, FF, FS and SF/a supply voltage: HVDD and LVDD/a temperature: Cold and Hot) based on the PVT variation analysis of FIG. 7B are illustrated. When analyzing the performance in a corner "SS/LVDD/Hot" that is one of the corners with the greatest change, it may be seen that the performance change of about 21% to 26% occurs. When analyzing the performance in a corner "FF/HVDD/Cold" that is another one of the corners with the greatest change, it may be seen that the performance change of about 12% to 21% occurs.

Figure 7D:
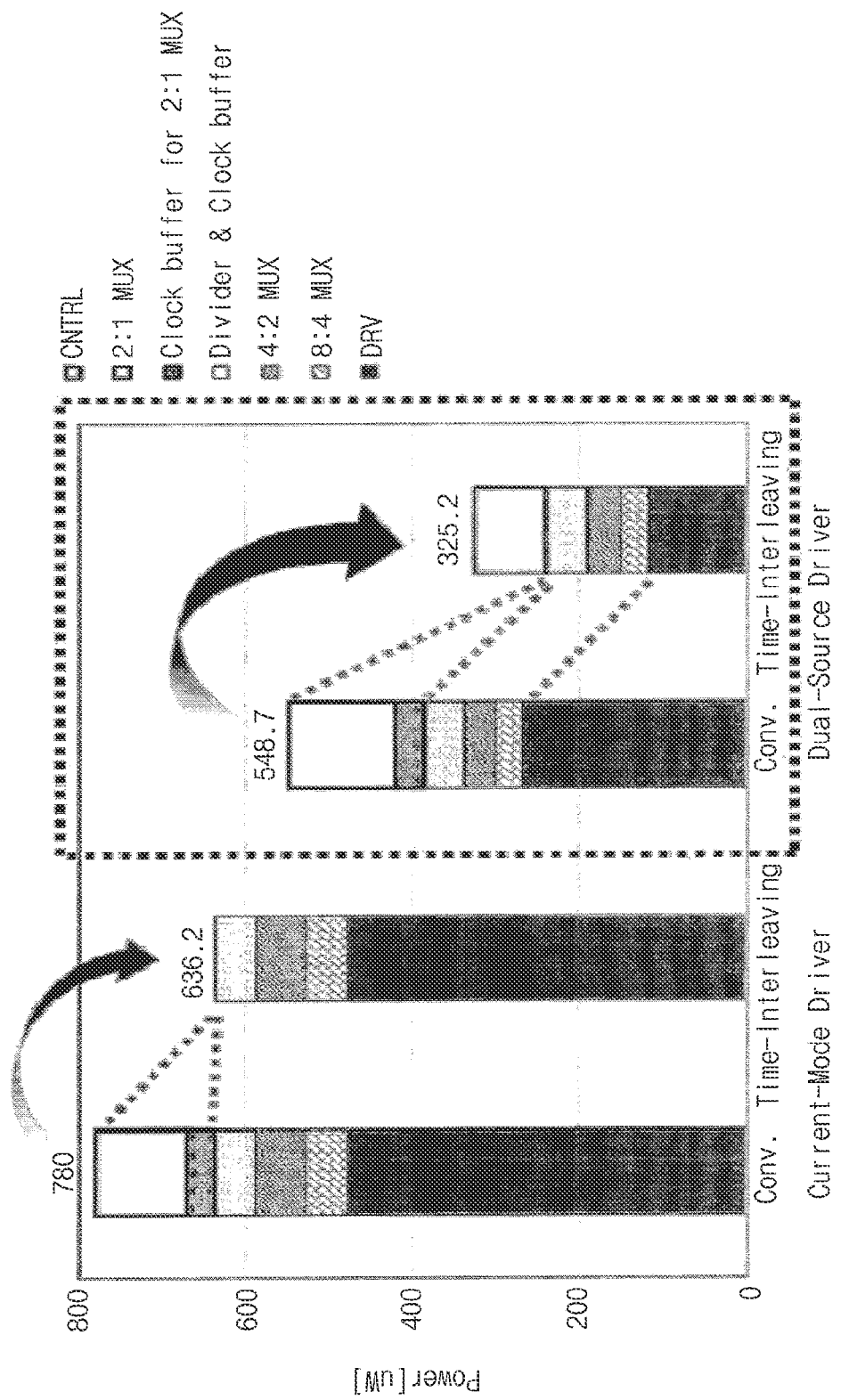

Referring to FIG. 7D, the power consumption is illustrated for the transmitter 100a according to an embodiment. In FIG. 7D, a graph on the left side illustrates the power consumption by a related-art transmitter using the current mode driver (e.g., the CML driver), and a graph on the right side illustrates the power consumption by the transmitter according to an embodiment of the present disclosure using the voltage mode driver (e.g., the dual source driver). It may be seen that the power consumption by the transmitter according to an embodiment is reduced by about 59% as compared to the related-art transmitter. In addition, it may be seen that the power consumption by the transmitter according to an embodiment is reduced by about 41% as compared to a transmitter without the time-interleaved scheme and the reduction in the power consumption by the serialization is about 26%.

Figure 8:
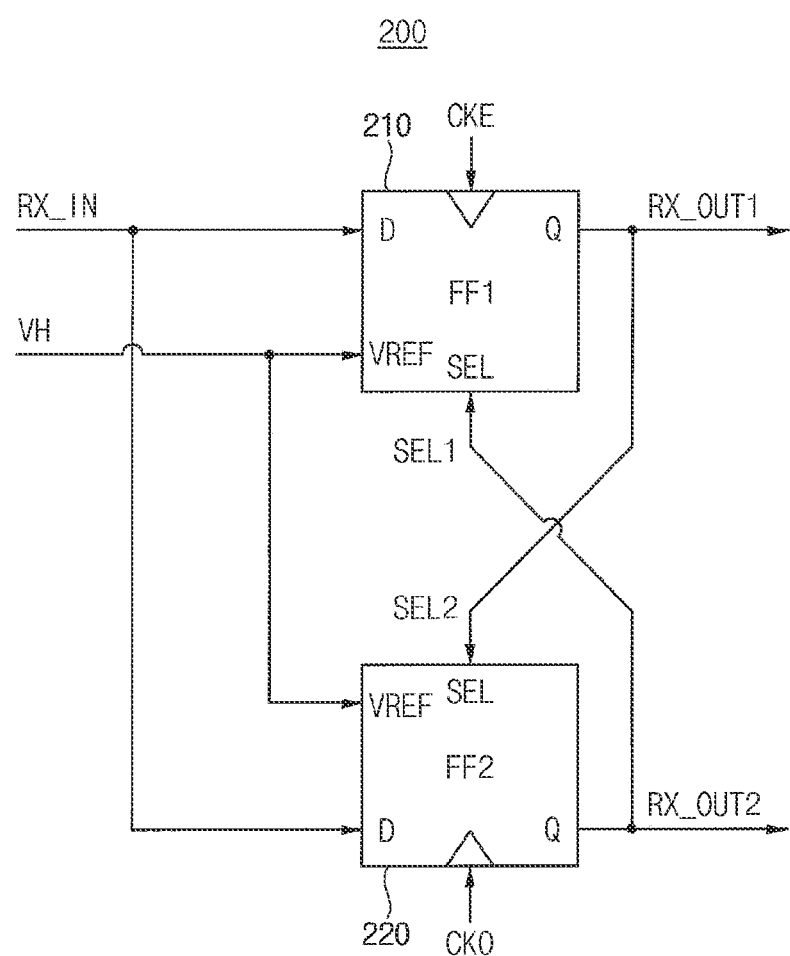
FIG. 8 is a block diagram illustrating a receiver according to an embodiment.

FIG. 8 illustrates a receiver according to an embodiment. Referring to FIG. 8, a receiver 200 includes a first flip-flop (FF1) 210 and a second flip-flop (FF2) 220.

The first flip-flop 210 receives an input data signal RX_IN, and generates a first output data signal RX_OUT1 based on the input data signal RX_IN, a first clock signal CKE, a first reference voltage VH and a first selection signal SEL1. The second flip-flop 220 receives the input data signal RX_IN, and generates a second output data signal RX_OUT2 based on the input data signal RX_IN, a second clock signal CKO different from the first clock signal CKE, the first reference voltage VH and a second selection signal SEL2.

As described with reference to FIG. 1, the input data signal RX_IN is a duobinary signal and has three voltage levels that are different from each other, and each of the first and second output data signals RX_OUT1 and RX_OUT2 is a binary signal and has two voltage levels that are different from each other. One of the first and second output data signals RX_OUT1 and RX_OUT2 (e.g., the first output data signal RX_OUT1) may correspond to the output data signal RX_OUT in FIG. 1.

Each of the first and second flip-flops 210 and 220 may include a first input terminal D receiving the input data signal RX_IN, a clock terminal receiving a respective one of the clock signals CKE and CKO, an output terminal Q outputting a respective one of the output data signals RX_OUT1 and RX_OUT2, a reference voltage terminal VREF receiving the first reference voltage VH, and a selection terminal SEL receiving a respective one of the selection signals SEL1 and SEL2. The second output data signal RX_OUT2 of the second flip-flop 220 may be provided to the first flip-flop 210 as the first selection signal SEL1, and the first output data signal RX_OUT1 of the first flip-flop 210 may be provided to the second flip-flop 220 as the second selection signal SEL2.

A second reference voltage (e.g., VL) different from the first reference voltage VH may be formed or generated in the first flip-flop 210 based on the first reference voltage VH and the first selection signal SEL1. Similarly, the second reference voltage VL may be formed or generated in the second flip-flop 220 based on the first reference voltage VH and the second selection signal SEL2. In other words, substantially the same operation and/or effect as using two different reference voltages VH and VL may be obtained by using but one reference voltage VH.

The first flip-flop 210 and the second flip-flop 220 may be referred to as an even flip-flop and an odd flip-flop, respectively. The first clock signal CKE and the second clock signal CKO may be referred to as an even clock signal and an odd clock signal, respectively. For example, the first and second clock signals CKE and CKO may have phases opposite to each other. The receiver 200 may operate with about a half frequency using the clock signals having opposite phases.

The receiver 200 according to an embodiment may receive and sense the input data signal RX_IN that is the duobinary signal having the three voltage levels using but one reference voltage VH.

Figure 9:
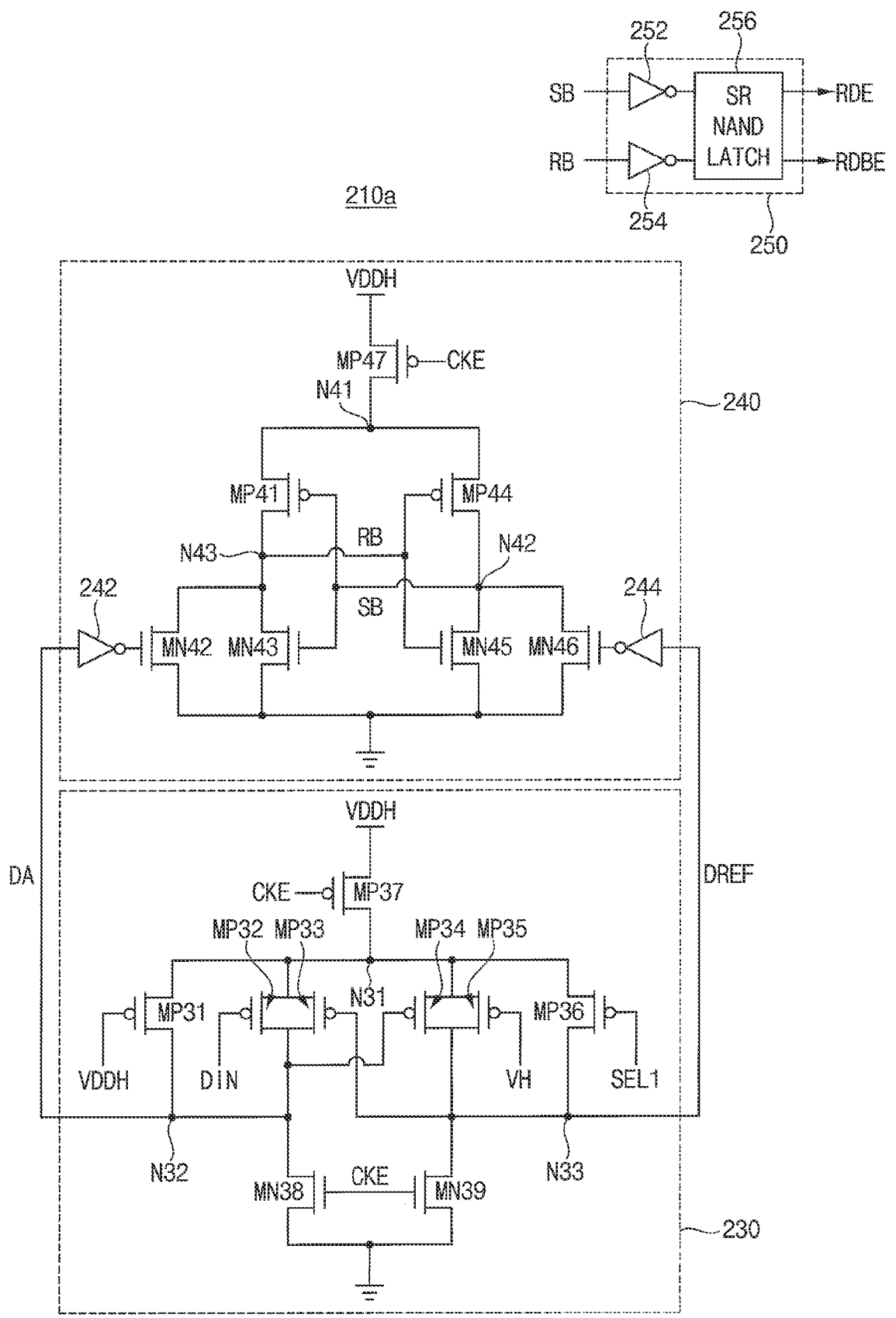
FIG. 9 is a circuit diagram illustrating an example of a first flip-flop included in a receiver of FIG. 8.
Figure 10A:
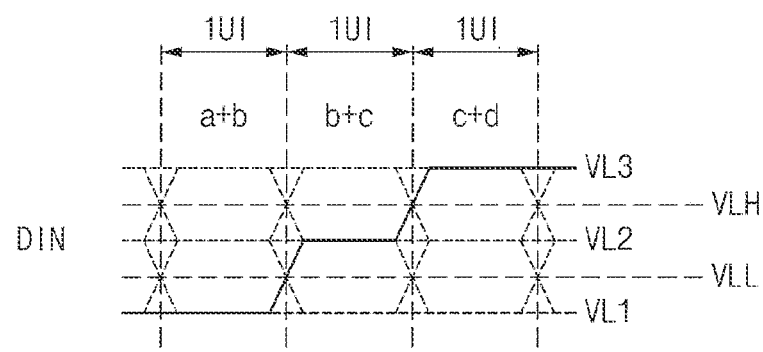
FIGS. 10A and 10B are signal diagrams illustrating an example of signals that are input to or output from a first flip-flop of FIG. 9.
Figure 10B:
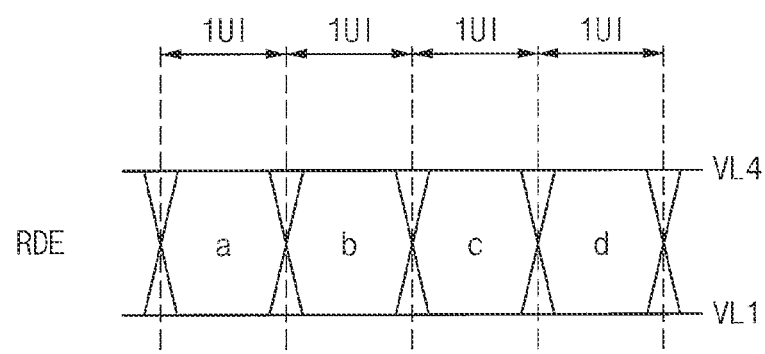

FIG. 9 illustrates an example of a first flip-flop included in a receiver of FIG. 8. FIGS. 10A and 10B illustrate an example of signals that are input to or output from a first flip-flop of FIG. 9.

Referring to FIGS. 9, 10A and 10B, a first flip-flop 210a may include a first circuit 230, a second circuit 240 and an output circuit 250. In an example of FIG. 9, the input data signal RX_IN in FIG. 8 may correspond to an input data signal DIN, and the first output data signal RX_OUT1 in FIG. 8 may correspond to an output data signal RDE.

The first circuit 230 may generate a first data signal DA and a second data signal DREF based on a power supply voltage VDDH, the input data signal DIN, the first clock signal CKE, the first reference voltage VH and the first selection signal SEL1. The first circuit 230 may include a first structure used to form or generate the second reference voltage VL, and a second structure used to boost the first and second data signals DA and DREF.

As illustrated in FIG. 10A, the input data signal DIN may have a waveform substantially the same as that of the output data signal TOUT of FIG. 4E, and may have the first, second and third voltage levels VL1, VL2 and VL3. The first reference voltage VH may have a voltage level VLH between the second and third voltage levels VL2 and VL3, and the second reference voltage VL may have a voltage level VLL between the first and second voltage levels VL1 and VL2. For example, the voltage level VLH of the first reference voltage VH may be about 0.45V, and the voltage level VLL of the second reference voltage VL may be about 0.15V.

The first circuit 230 may include a first transistor MP31, a second transistor MP32, a third transistor MP33, a fourth transistor MP34, a fifth transistor MP35, a sixth transistor MP36, a seventh transistor MP37, an eighth transistor MN38 and a ninth transistor MN39.

The first, second and third transistors MP31, MP32 and MP33 may be connected in parallel between a node N31 and a first data node N32 providing the first data signal DA. The first transistor MP31 may have a gate electrode receiving the power supply voltage VDDH. The second transistor MP32 may have a gate electrode receiving the input data signal DIN. The third transistor MP33 may have a gate electrode connected to a second data node N33 providing the second data signal DREF. The fourth, fifth and sixth transistors MP34, MP35 and MP36 may be connected in parallel between the node N31 and the second data node N33. The fourth transistor MP34 may have a gate electrode connected to the first data node N32. The fifth transistor MP35 may have a gate electrode receiving the first reference voltage VH. The sixth transistor MP36 may have a gate electrode receiving the first selection signal SEL1. The seventh transistor MP37 may be connected between the power supply voltage VDDH and the node N31, and may have a gate electrode receiving the first clock signal CKE. The eighth transistor MN38 may be connected between the first data node N32 and a ground voltage, and may have a gate electrode receiving the first clock signal CKE. The ninth transistor MN39 may be connected between the second data node N33 and the ground voltage, and may have a gate electrode receiving the first clock signal CKE.

In an embodiment, the sixth transistor MP36 may correspond to the first structure for forming the second reference voltage VL. For example, when the first selection signal SEL1, which is the second output data signal RX_OUT2 of the second flip-flop 220 (e.g., the previous data output of the second flip-flop 220), has a high level (e.g., "1"), the sixth transistor MP36 may be turned off, and the first circuit 230 may generate the first and second data signals DA and DREF by comparing the input data signal DIN with the first reference voltage VH. When the first selection signal SEL1 has a low level (e.g., "0"), the sixth transistor MP36 may be turned on, an additional current may flow to the second data node N33 by the sixth transistor MP36 that is turned on, and thus almost the same current as when the second reference voltage VL is applied to the fifth transistor MP35 may be provided to the second data node N33. In other words, when the first selection signal SEL1 has the low level, a driving current corresponding to the second reference voltage VL may be provided or applied to the second data node N33 based on the first reference voltage VH, the first selection signal SEL1 and the fifth and sixth transistors MP35 and MP36, and the first circuit 230 may generate the first and second data signals DA and DREF by comparing the input data signal DIN with the second reference voltage VL.

In an embodiment, the third and fourth transistors MP33 and MP34 may correspond to the second structure for boosting the first and second data signals DA and DREF. For example, a current flowing to the first and second data nodes N32 and N33 may be temporarily boosted by the third and fourth transistors MP33 and MP34 during an evaluation timing. When an input having the first voltage level (e.g., about 0V) through which a relatively large amount of current flows is applied, the effect of the boosted current may be relatively small. When an input having the third voltage level (e.g., about 0.6V) through which a relatively small amount of current flows is applied, the effect of the boosted current may be relatively large. As a result, changes in the output delay depending on the input level or case may be reduced.

The second circuit 240 may generate a third data signal SB and a fourth data signal RB based on the power supply voltage VDDH, the first and second data signals DA and DREF and the first clock signal CKE. The second circuit 240 may include a third structure used to enhance the input offset.

The second circuit 240 may include a first inverter 242, a second inverter 244, a first transistor MP41, a second transistor MN42, a third transistor MN43, a fourth transistor MP44, a fifth transistor MN45, a sixth transistor MN46 and a seventh transistor MP47. In an alternate embodiment, the first and second inverters 242 and 244 may be omitted, and the second and sixth N-type transistors MN42 and MN46 may be replaced with P-type transistors MP42 and MP46.

The first inverter 242 may receive the first data signal DA. The second inverter 244 may receive the second data signal DREF. The first transistor MP41 may have a gate electrode connected to a third data node N42 providing the third data signal SB, and may be connected between a node N41 and a fourth data node N43 providing the fourth data signal RB. The second and third transistors MN42 and MN43 may be connected in parallel between the fourth data node N43 and the ground voltage. The second transistor MN42 may have a gate electrode connected to an output of the first inverter 242. The third transistor MN43 may have a gate electrode connected to the third data node N42. The fourth transistor MP44 may be connected between the node N41 and the third data node N42, and may have a gate electrode connected to the fourth data node N43. The fifth and sixth transistors MN45 and MN46 may be connected in parallel between the third data node N42 and the ground voltage. The fifth transistor MN45 may have a gate electrode connected to the fourth data node N43. The sixth transistor MN46 may have a gate electrode connected to an output of the second inverter 244. The seventh transistor MP47 may be connected between the power supply voltage VDDH and the node N41, and may have a gate electrode receiving the first clock signal CKE.

In an embodiment, the first and second inverters 242 and 244 may correspond to the third structure for enhancing the input offset. For example, by adding the first and second inverters 242 and 244, the input offset occurring in a related-art structure may be enhanced.

The output circuit 250 may generate the output data signal RDE and an inverted output data signal RDBE based on the third and fourth data signals SB and RB.

The output circuit 250 may include a first inverter 252, a second inverter 254 and an SR NAND latch 256. The first inverter 252 may receive the third data signal SB. The second inverter 254 may receive the fourth data signal RB. The SR NAND latch 256 may generate the output data signal RDE and the inverted output data signal RDBE based on outputs of the first and second inverters 252 and 254.

The power supply voltage VDDH may be different from the first and second power supply voltages VDDL1 and VDDL2 in FIG. 3, and may have the fourth voltage level VL4. Thus, as illustrated in FIG. 10B, two voltage levels of the output data signal RDE generated based on the power supply voltage VDDH may include the first voltage level VL1 and the fourth voltage level VL4. In addition, the output data signal RDE may be generated such that the values "a", "b", "c" and "d" of the input data signals D0, D1, D2 and D3 of the transmitter 100a in FIG. 4A are sequentially arranged.

In an embodiment, each of the transistors MP31, MP32, MP33, MP34, MP35, MP36, MP37, MP41, MP44 and MP47 may be a PMOS transistor, and each of the transistors MN38, MN39, MN42, MN43, MN45 and MN46 may be an NMOS transistor.

Although illustrative embodiments are described based on an example of using one reference voltage VH, embodiments are not limited thereto. For example, one reference voltage VL may be used to generate the output data signal.

Figure 11A:
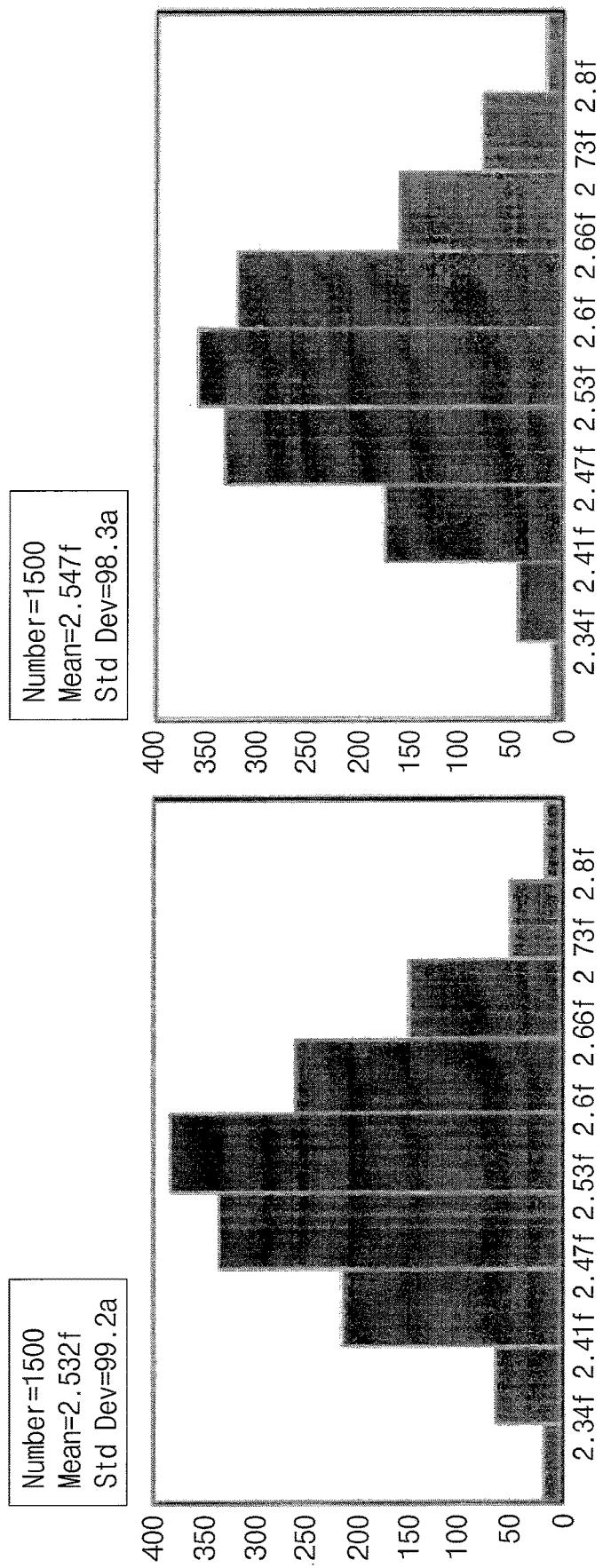
FIGS. 11A and 11B are graphical diagrams illustrating performance of a receiver of FIGS. 8 and 9.
Figure 11B:
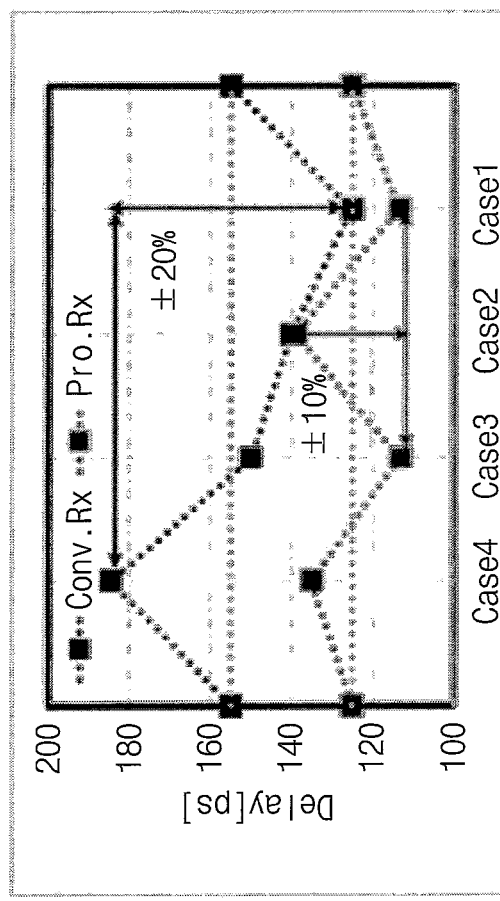

FIGS. 11A and 11B illustrate performance of a receiver of FIGS. 8 and 9. In particular, FIGS. 11A and 11B illustrate simulation results for the receiver of FIGS. 8 and 9.

Referring to FIG. 11A, a current generated by the receiver 200 according to an embodiment is illustrated. In FIG. 11A, a graph on the left side illustrates a driving current Iconv that is generated by the second reference voltage VL in a related-art receiver operating based on two reference voltages VH and VL, and a graph on the right side illustrates a driving current Ipro that is generated by the first reference voltage VH and the first selection signal SEL1 in the receiver 200 according to an embodiment operating based on only the first reference voltage VH. In the related-art receiver, it may be seen that an average or mean of the driving current Iconv is about 2.53f, a standard deviation or sigma of the driving current Iconv is about 99.2a, and a mean over sigma of the driving current Iconv is about 0.026. In the receiver 200 according to the embodiment, it may be seen that a mean of the driving current Ipro is about 2.54f, a standard deviation of the driving current Ipro is about 98.3a, and a mean over sigma of the driving current Ipro is also about 0.026. Thus, it may be seen that the driving current Iconv and the driving current Ipro are comparable with each other.

Referring to FIG. 11B, the performance of the receiver 200 according to an embodiment is illustrated. In FIG. 11B, a table on the left side illustrates the performance of the related-art receiver, and a table on the right side illustrates the performance of the receiver 200 according to an embodiment. In addition, in FIG. 11B, "Case 1" represents that the input is about 0V and the reference voltage is about 0.15V, "Case 2" represents that the input is about 0.3V and the reference voltage is about 0.15V, "Case 3" represents that the input is about 0.3V and the reference voltage is about 0.45V, and "Case 4" represents that the input is about 0.6V and the reference voltage is about 0.45V. As a result of checking delays of "Case 1", "Case 2", "Case 3" and "Case 4", it may be seen that the delay in "Case 2" decreases by about 1%, and the delay in "Case 4" decreases by about 27%. Further, it may be seen that the delay variation for each input case is improved by about 50% from about ±20% to ±10% with respect to the median value.

Figure 12:
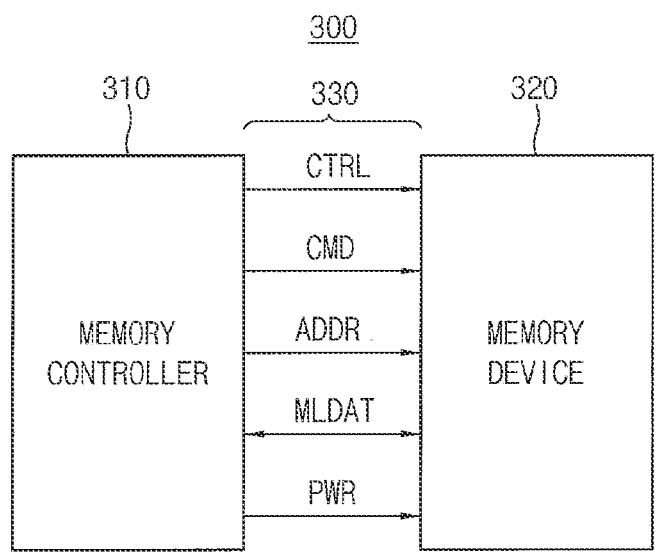
FIG. 12 is a block diagram illustrating a memory system according to an embodiment.

FIG. 12 illustrates a memory system according to an embodiment. Referring to FIG. 12, a memory system 300 includes a memory controller 310 and a memory device 320. The memory system 300 may further include a plurality of signal lines 330 that electrically connect the memory controller 310 with the memory device 320.

The memory device 320 is controlled by the memory controller 310. For example, based on requests from a host, the memory controller 310 may store (e.g., write or program) data into the memory device 320, or may retrieve (e.g., read or sense) data from the memory device 320. For example, the memory device 320 may include a high bandwidth memory (HBM) device.

The plurality of signal lines 330 may include control lines, command lines, address lines, data input/output (I/O) lines and power supply lines. The memory controller 310 may transmit a command CMD, an address ADDR and a control signal CTRL to the memory device 320 via the command lines, the address lines and the control lines, may exchange a data signal MLDAT with the memory device 320 via the data I/O lines, and may transmit a power supply voltage PWR to the memory device 320 via the power supply lines. For example, the control signal CTRL may include a chip enable signal (CE), a write enable signal (WE), a read enable signal (RE), a command latch enable signal (CLE), an address latch enable signal (ALE), or the like. For example, the data signal MLDAT may be a multi-level signal, and may be a duobinary signal that is generated by the transmitter according to an embodiment and received by the receiver according to an embodiment.

In an embodiment, the plurality of signal lines 330 may further include data strobe (DQS) signal lines for transmitting a DQS signal. The DQS signal may be a signal for providing a reference time point used to determine a logic value of the data signal MLDAT exchanged between the memory controller 310 and the memory device 320.

In an embodiment, at least a part of the plurality of signal lines 330 may be referred to as a channel. The term "channel" as used herein may represent signal lines that include the data I/O lines for transmitting the data signal MLDAT. However, embodiments are not limited thereto, and the channel may further include the command lines for transmitting the command CMD and/or the address lines for transmitting the address ADDR. For example, the channel may include at least one through silicon via (TSV).

Figure 13:
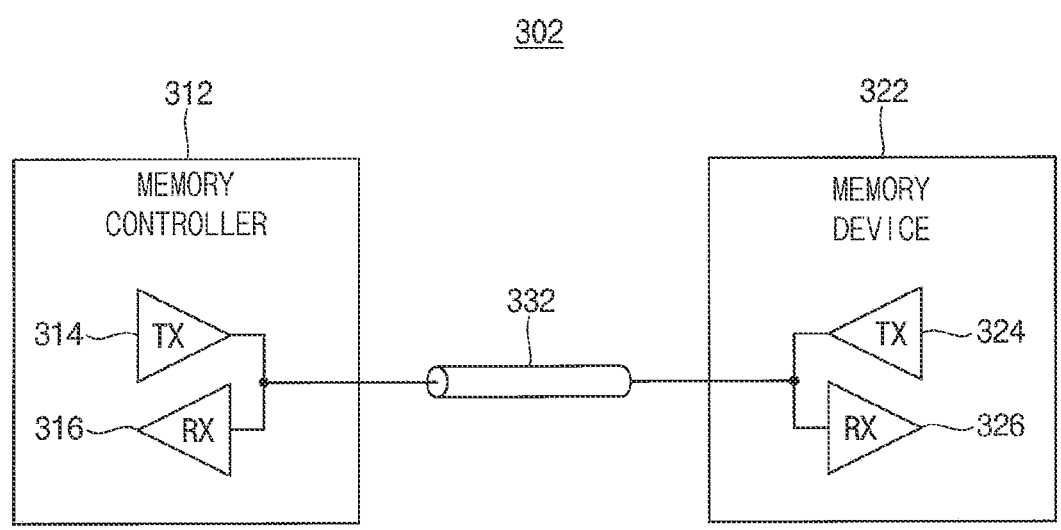
FIG. 13 is a block diagram illustrating an example of a memory system of FIG. 12.

FIG. 13 illustrates an example of a memory system of FIG. 12. Referring to FIG. 13, a memory system 302 includes a memory controller 312, a memory device 322 and a channel 332.

The memory controller 312 includes a first transmitter 314 and a first receiver 316. The memory device 322 includes a second transmitter 324 and a second receiver 326. The first transmitter 314 and the first receiver 316 are connected to the second transmitter 324 and the second receiver 326 through the channel 332. In an embodiment, each of the memory controller 312 and the memory device 322 may include a plurality of transmitters and a plurality of receivers, and the memory system 302 may include a plurality of channels for connecting the plurality of transmitters with the plurality of receivers.

The transmitters 314 and 324 output write data to be stored in the memory device 322 or read data retrieved from the memory device 322, respectively; the channel 332 transmits the write data or the read data; and the receivers 326 and 316 and receive the write data or read data, respectively. For example, during a data write operation, the transmitter 314 may generate a data signal corresponding to the write data and may output the data signal through the channel 332, the receiver 326 may receive the data signal, and the data write operation may be performed based on the received data signal. During a data read operation, the transmitter 324 may generate a data signal corresponding to the read data and may output the data signal through the channel 332, the receiver 316 may receive the data signal, and the data read operation may be performed based on the received data signal.

Each of the transmitters 314 and 324 may be the transmitter according to an embodiment, and may generate the duobinary signal according to an embodiment. Each of the receivers 316 and 326 may be the receiver according to an embodiment, and may receive the duobinary signal according to an embodiment.

Figure 14A:
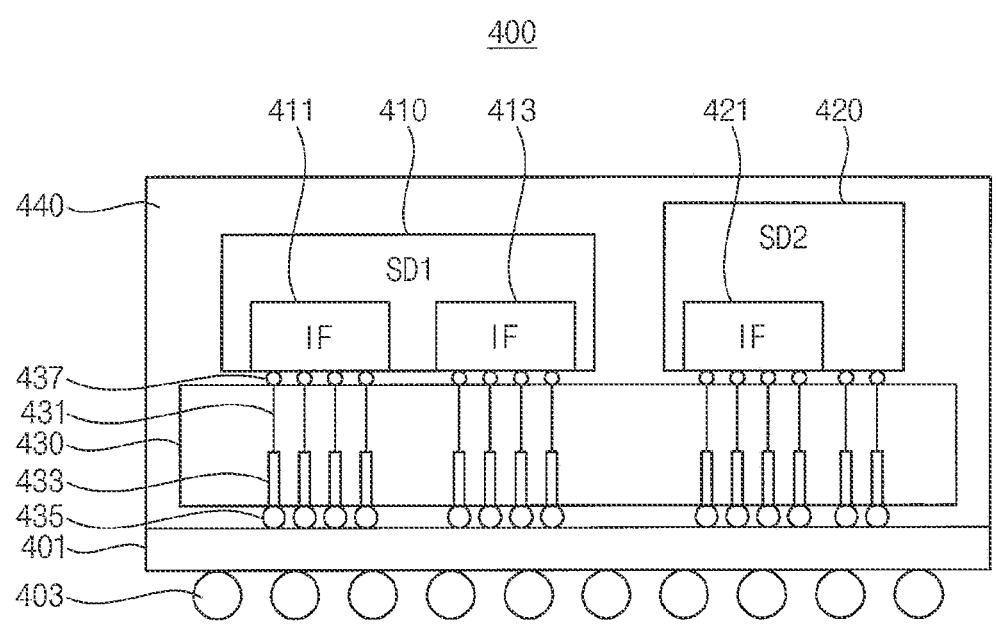
FIGS. 14A and 14B are cross-sectional diagrams illustrating examples of a semiconductor package including a memory system of FIGS. 12 and 13.
Figure 14B:
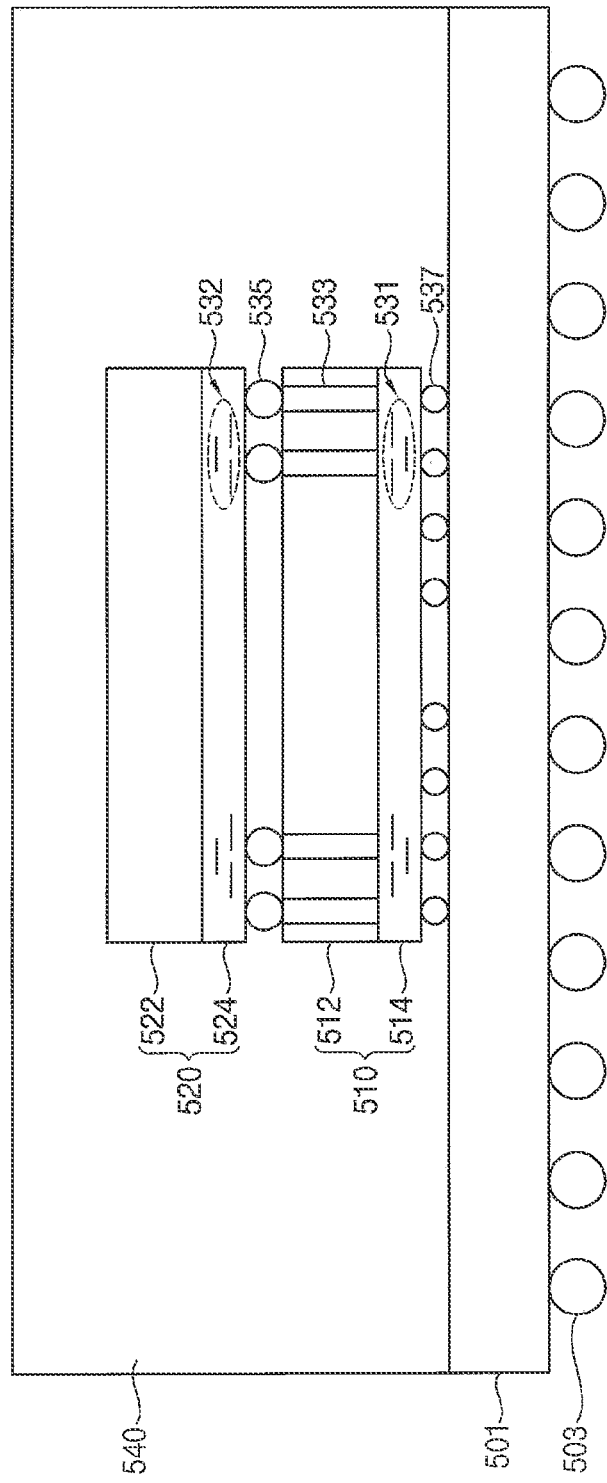

FIGS. 14A and 14B are cross-sectional views of examples of a semiconductor package including a memory system of FIGS. 12 and 13.

Referring to FIG. 14A, a semiconductor package 400 includes a package substrate 401, a first semiconductor device (SD1) 410, a second semiconductor device (SD2) 420 and an interposer 430. The semiconductor package 400 may further include a sealing member 440.

The semiconductor package 400 may be a memory package having a stacked chip structure in which a plurality of dies (or chips) are stacked. For example, the semiconductor package 400 may be implemented in a 2.5-dimensional (2.5D) structure, and may include a semiconductor device and a memory device with a 2.5D chip structure. For example, the first semiconductor device 410 may include a logic semiconductor device, and the second semiconductor device 420 may include a memory device. For example, the logic semiconductor device may operate as a host or a memory controller, and may include a central processing unit (CPU), a graphic processing unit (GPU), a system-on-chip (SoC), an application specific integrated circuit (ASIC), or the like. For example, the memory device may include a high bandwidth memory (HBM) device.

The package substrate 401 may have an upper surface and a lower surface that are opposite to each other. For example, the package substrate 401 may be a printed circuit board (PCB). The PCB may be a multilayered circuit board including vias and various circuits therein.

The interposer 430 may be disposed on the package substrate 401. The interposer 430 may be mounted on the package substrate 401 by solder bumps 435. For example, the solder bumps 435 may be C4 bumps. For example, a planar area of the interposer 430 may be less than a planar area of the package substrate 401. In other words, the interposer 430 may be disposed within the area of the package substrate 401 in a plan view.

The interposer 430 may include a plurality of connection wirings 431 and a plurality of through electrodes 433 therein. For example, the interposer 430 may be a silicon interposer including a silicon substrate that is a semiconductor substrate, and the plurality of through electrodes 433 may be through silicon vias (TSVs) penetrating the silicon substrate.

The first semiconductor device 410 and the second semiconductor device 420 may be connected to each other through the plurality of connection wirings 431 and/or may be electrically connected to the package substrate 401 through the plurality of through electrodes (e.g., the through silicon vias) 433 and the solder bumps (e.g., the C4 bumps) 435. The silicon interposer may provide a high density interconnection between the first and second semiconductor devices 410 and 420.

The first semiconductor device 410 and the second semiconductor device 420 may be disposed on the interposer 430. The first semiconductor device 410 and the second semiconductor device 420 may be mounted on the interposer 430 by a flip chip bonding scheme. For example, the first semiconductor device 410 and the second semiconductor device 420 may be mounted on the interposer 430 such that active surfaces of the first semiconductor device 410 and the second semiconductor device 420 on which chip pads are disposed face the interposer 430. The chip pads of the first semiconductor device 410 and the second semiconductor device 420 may be electrically connected to connection pads of the interposer 430 by solder bumps 437 that are conductive bumps. For example, the solder bumps 437 may be uBumps.

Although FIG. 14A illustrates that the semiconductor package 400 includes one first semiconductor device 410 and one second semiconductor device 420, embodiments are not limited thereto. For example, the second semiconductor device 420 may include a buffer die and a plurality of memory dies (or chips) stacked on the buffer die. The buffer die and the plurality of memory dies may be electrically connected to each other by TSVs.

The first semiconductor device 410, the second semiconductor device 420 and the interposer 430 may be fixed by the sealing member 440.

In an embodiment, the semiconductor package 400 may further include a first adhesive underfilled between the interposer 430 and the package substrate 401, a second adhesive underfilled between the first semiconductor device 410 and the interposer 430, and/or a third adhesive underfilled between the second semiconductor device 420 and the interposer 430. For example, the first, second and third adhesives may include an epoxy material to reinforce a gap between the interposer 430 and the package substrate 401 and a gap between the interposer 430 and each of the first and second semiconductor devices 410 and 420.

External connection pads may be disposed on the lower surface of the package substrate 401, and external connectors 403 for an electrical connection with an external device may be disposed on the external connection pads. For example, the external connectors 403 may be solder balls (e.g., ball grid arrays (BGAs)). The semiconductor package 400 may be mounted on a module substrate (e.g., a board substrate) (not illustrated) by the external connectors 403, thus constituting a memory module.

The first semiconductor device 410 may include an interface (IF) 411 for communicating with the outside of the semiconductor package 400. For example, the interface 411 may include at least one of various serial interfaces. The first semiconductor device 410 may include an interface 413 for communicating with the second semiconductor device 420, and the second semiconductor device 420 may include an interface 421 for communicating with the first semiconductor device 410. For example, each of the interfaces 413 and 421 may include a HBM physical layer (PHY) unit for a memory interface.

In an example of FIG. 14A, the semiconductor substrate (e.g., the silicon substrate), the plurality of connection wirings 431 and the plurality of through electrodes 433 (e.g., the through silicon vias) that are included in the interposer 430 may correspond to the channel described with reference to FIGS. 12 and 13. The interfaces 411, 413 and 421 may include the transmitter and the receiver according to an embodiment.

Referring to FIG. 14B, a semiconductor package 500 includes a package substrate 501, a first semiconductor device 510 and a second semiconductor device 520. The semiconductor package 500 may further include a sealing member 540.

The semiconductor package 500 may be similar to the semiconductor package 400 of FIG. 14A, except that the interposer 430 in FIG. 14A is omitted, the first and second semiconductor devices 510 and 520 are stacked in the vertical direction, and through electrodes and connection wirings are included in the first and second semiconductor devices 510 and 520, not in the interposer 430.

The semiconductor package 500 may be a memory package having a stacked chip structure in which a plurality of dies (or chips) are stacked. For example, the semiconductor package 500 may be implemented in a three-dimensional (3D) structure, and may include a semiconductor device and a memory device with a 3D chip structure. For example, the first semiconductor device 510 may include a logic semiconductor device, and the second semiconductor device 520 may include a memory device.

The package substrate 501, external connectors 503 and the sealing member 540 may be substantially the same as the package substrate 401, external connectors 403 and the sealing member 440 in FIG. 14A, respectively.

The first semiconductor device 510 may be disposed on the package substrate 501. The first semiconductor device 510 may be mounted on the package substrate 501 by a flip chip bonding scheme. For example, the first semiconductor device 510 may be mounted on the package substrate 501 such that an active surface of the first semiconductor device 510 on which chip pads are disposed faces the package substrate 501. The chip pads of the first semiconductor device 510 may be electrically connected to connection pads of the package substrate 501 by solder bumps (e.g., uBumps) 537 that are conductive bumps.

The first semiconductor device 510 may include a semiconductor substrate 512 and a wiring layer 514. The semiconductor substrate 512 may include a circuit structure (not illustrated) such as a transistor, and may include a plurality of through electrodes (e.g., through silicon vias) 533 penetrating therethrough. Although not illustrated in detail, the wiring layer 514 may include a plurality of connection wiring 531 and a plurality of vias.

The second semiconductor device 520 may be disposed on the first semiconductor device 510. The second semiconductor device 520 may be mounted on the first semiconductor device 510 by a flip chip bonding scheme. For example, the second semiconductor device 520 may be mounted on the first semiconductor device 510 such that an active surface of the second semiconductor device 520 on which chip pads are disposed faces the first semiconductor device 510. The chip pads of the second semiconductor device 520 may be electrically connected to the plurality of through electrodes (e.g., the through silicon vias) 533 of the first semiconductor device 510 by solder bumps (e.g., C4 bumps) 535 that are conductive bumps.

The second semiconductor device 520 may include a semiconductor substrate 522 and a wiring layer 524. The semiconductor substrate 522 may include a circuit structure (not illustrated) such as a transistor. Although not illustrated in detail, the wiring layer 524 may include a plurality of connection wiring 532 and a plurality of vias.

Although FIG. 14B illustrates that the semiconductor package 500 includes one first semiconductor device 510 and one second semiconductor device 520, embodiments are not limited thereto. For example, at least one other second semiconductor device may be stacked on the second semiconductor device 520. In this example, as with the first semiconductor device 510, the semiconductor substrate 522 of the second semiconductor device 520 may include through electrodes.

In an example of FIG. 14B, the plurality of through electrodes 533, the solder bumps 535, and the plurality of connection wiring 531 and 532 in the wiring layers 514 and 524 may correspond to the channel described with reference to FIGS. 12 and 13.

The inventive concept may be applied to various electronic devices and systems that include the transmitters, the receivers and the memory systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of embodiments and is not to be construed as limiting thereof. Although some embodiments have been described for ease of understanding, those of ordinary skill in the pertinent art will readily appreciate that modifications are possible in the disclosed and other embodiments without materially departing from the teachings of the present disclosure. Therefore, it is to be understood that the foregoing is illustrative of descriptive embodiments and is not to be construed as limited to the specific embodiments disclosed, and that modifications to the disclosed embodiments, as well as other embodiments, are intended to be included within the scope of the present disclosure. Accordingly, all such embodiments may be included within the scope and spirit of the present disclosure as limited only by the metes and bounds of the claims.

What is claimed is:

1. A transmitter comprising:
a multiplexer configured to generate a plurality of time-interleaved data signals based on a plurality of input data signals and multi-phase clock signals, the plurality of input data signals being input in parallel, each of the plurality of input data signals having at least two voltage levels that are different from each other;
control logic configured to generate a plurality of control signals based on the plurality of time-interleaved data signals, at least one of the plurality of control signals having a voltage level that is temporarily boosted; and
a voltage mode driver configured to generate an output data signal based on the plurality of control signals, the output data signal having at least three voltage levels that are different from each other.

2. The transmitter of claim 1, wherein:
the plurality of input data signals include a first input data signal, a second input data signal, a third input data signal and a fourth input data signal,
the multi-phase clock signals include a first clock signal, a second clock signal, a third clock signal and a fourth clock signal of which phases partially overlap, and
the plurality of time-interleaved data signals include a first time-interleaved data signal and a second time-interleaved data signal.

3. The transmitter of claim 2, wherein the multiplexer includes:
a first transistor connected between a first input node receiving the first input data signal and a first output node providing the first time-interleaved data signal, and having a gate electrode receiving the first clock signal;
a second transistor connected between a second input node receiving the second input data signal and a second output node providing the second time-interleaved data signal, and having a gate electrode receiving the second clock signal;
a third transistor connected between a third input node receiving the third input data signal and the first output node, and having a gate electrode receiving the third clock signal; and
a fourth transistor connected between a fourth input node receiving the fourth input data signal and the second output node, and having a gate electrode receiving the fourth clock signal.

4. The transmitter of claim 2, wherein:
the plurality of control signals includes at least one pull-down control signal having a voltage level that is not temporarily boosted and a plurality of pull-up control signals having voltage levels that are temporarily boosted,
the at least one pull-down control signal includes a first pull-down control signal, and
the plurality of pull-up control signals include a first pull-up control signal and a second pull-up control signal.

5. The transmitter of claim 4, wherein the control logic includes:
a first NAND gate configured to perform a NAND operation on the first and second time-interleaved data signals;
a NOR gate configured to generate the first pull-down control signal by performing a NOR operation on the first and second time-interleaved data signals;
an inverter configured to invert an output of the NOR gate;
a second NAND gate configured to perform a NAND operation on an output of the first NAND gate and an output of the inverter;
a first boosting circuit configured to generate the first pull-up control signal based on the output of the first NAND gate; and
a second boosting circuit configured to generate the second pull-up control signal based on an output of the second NAND gate.

6. The transmitter of claim 5, wherein at least one of the first boosting circuit or the second boosting circuit includes:
a pulse generator connected to an input node receiving the output of the respective NAND gate, and configured to generate a pulse signal based on the output of the respective NAND gate;
a first transistor connected between a first power supply voltage and a first node, and having a gate electrode receiving the pulse signal;
a capacitor connected between the gate electrode of the first transistor and the first node;
a second transistor connected between the first node and an output node providing the first pull-up control signal, and having a gate electrode connected to the input node; and
a third transistor connected between the output node and a ground voltage, and having a gate electrode connected to the input node.

7. The transmitter of claim 6, wherein:
when a voltage at the input node has a high level, the capacitor is precharged based on the first power supply voltage, and
when the voltage at the input node is transitioned from the high level to a low level, the output node is boosted for a predetermined time interval based on charges precharged in the capacitor.

8. The transmitter of claim 4, wherein the three voltage levels of the output data signal include a first voltage level, a second voltage level higher than the first voltage level, and a third voltage level higher than the second voltage level.

9. The transmitter of claim 8, wherein the voltage mode driver includes:
a first transistor connected between an output node providing the output data signal and a ground voltage having the first voltage level, and having a gate electrode receiving the first pull-down control signal;
a second transistor connected between a first power supply voltage having the third voltage level and the output node, and having a gate electrode receiving the second pull-up control signal; and
a third transistor connected between a second power supply voltage having the second voltage level and the output node, and having a gate electrode receiving the first pull-up control signal.

10. The transmitter of claim 1, wherein:
the plurality of input data signals have a first data rate,
the plurality of time-interleaved data signals have a second data rate higher than the first data rate, and
the plurality of control signals and the output data signal have a third data rate higher than the second data rate.

11. The transmitter of claim 1, wherein:
the plurality of input data signals being binary signals having two voltage levels that are different from each other,
the plurality of output data signals being duobinary signals having three voltage levels that are different from each other,
the voltage mode driver is configured to sequentially output a sum of two adjacent input data signals among the plurality of input data signals as the output data signal.

12. A receiver comprising:
a first flip-flop configured to receive an input data signal having at least three voltage levels that are different from each other, a first clock signal, a first reference voltage and a first selection signal, form a second reference voltage different from the first reference voltage based on the first reference voltage and the first selection signal, generate a first output data signal based thereon, the first output data signal being a signal having at least two voltage levels that are different from each other, and provide the first output data signal as a second selection signal; and
a second flip-flop configured to receive the input data signal, a second clock signal different from the first clock signal, the first reference voltage and the second selection signal, generate a second output data signal based thereon, the second output data signal being a signal having at least two voltage levels that are different from each other, and provide the second output data signal as the first selection signal.

13. The receiver of claim 12, wherein the first flip-flop includes:
a first circuit configured to generate a first data signal and a second data signal based on a power supply voltage, the input data signal, the first clock signal, the first reference voltage and the first selection signal, and including a first structure configured to form the second reference voltage and a second structure configured to boost the first and second data signals;
a second circuit configured to generate a third data signal and a fourth data signal based on the power supply voltage, the first and second data signals and the first clock signal; and
an output circuit configured to generate the first output data signal based on the third and fourth data signals.

14. The receiver of claim 13, wherein the first circuit includes:
first, second, and third transistors connected in parallel between a first node and a first data node providing the first data signal, the first transistor having a gate electrode receiving the power supply voltage, the second transistor having a gate electrode receiving the input data signal, the third transistor having a gate electrode connected to a second data node providing the second data signal;
fourth, fifth and sixth transistors connected in parallel between the first node and the second data node, the fourth transistor having a gate electrode connected to the first data node, the fifth transistor having a gate electrode receiving the first reference voltage, the sixth transistor having a gate electrode receiving the first selection signal;
a seventh transistor connected between the power supply voltage and the first node, and having a gate electrode receiving the first clock signal;
an eighth transistor connected between the first data node and a ground voltage, and having a gate electrode receiving the first clock signal; and
a ninth transistor connected between the second data node and the ground voltage, and having a gate electrode receiving the first clock signal.

15. The receiver of claim 14, wherein:
the sixth transistor corresponds to the first structure, and provides a driving current corresponding to the second reference voltage to the second data node based on the first selection signal, and
the third and fourth transistors correspond to the second structure.

16. The receiver of claim 13, wherein the second circuit includes:
first and second inverters configured to receive the first and second data signals, respectively;
a first transistor having a gate electrode connected to a first data node providing the third data signal, and connected between a first node and a second data node providing the fourth data signal;
second and third transistors connected in parallel between the second data node and a ground voltage, the second transistor having a gate electrode receiving an output of the first inverter, the third transistor having a gate electrode connected to the first data node;
a fourth transistor connected between the first node and the first data node, and having a gate electrode connected to the second data node;
fifth and sixth transistors connected in parallel between the first data node and the ground voltage, the fifth transistor having a gate electrode connected to the second data node, the sixth transistor having a gate electrode receiving an output of the second inverter; and
a seventh transistor connected between the power supply voltage and the first node, and having a gate electrode receiving the first clock signal.

17. The receiver of claim 13, wherein the output circuit includes:
first and second inverters configured to receive the third and fourth data signals, respectively; and
an SR NAND latch configured to generate the first output data signal and an inverted first output data signal based on outputs of the first and second inverters.

18. The receiver of claim 12, wherein:
the input data signal being a duobinary signal having three voltage levels that are different from each other,
the three voltage levels of the input data signal include a first voltage level, a second voltage level higher than the first voltage level, and a third voltage level higher than the second voltage level,
the first reference voltage has a voltage level between the second and third voltage levels, and the second reference voltage has a voltage level between the first and second voltage levels,
the first output data signal being a binary signal having two voltage levels that are different from each other, and
the two voltage levels of the first output data signal include the first voltage level and a fourth voltage level higher than the third voltage level.

19. A memory system comprising:
a transmitter configured to output write data to be stored in a memory device or read data retrieved from the memory device;

a channel configured to transmit the write data or the read data; and a receiver configured to receive the write data or the read data, wherein the transmitter includes:
- a multiplexer configured to generate a plurality of time-interleaved data signals based on a plurality of input data signals and multi-phase clock signals, the plurality of input data signals being input in parallel, each of the plurality of input data signals having at least two voltage levels that are different from each other;
- control logic configured to generate a plurality of control signals based on the plurality of time-interleaved data signals, at least one of the plurality of control signals having a voltage level that is temporarily boosted; and
- a voltage mode driver configured to generate an output data signal based on the at least one pull-down control signal and the plurality of pull-up control signals, the output data signal having at least three voltage levels that are different from each other, wherein the receiver includes:
- a first flip-flop configured to receive the output data signal, a first clock signal, a first reference voltage and a first selection signal, form a second reference voltage different from the first reference voltage based on the first reference voltage and the first selection signal, generate a first data signal based thereon, the first data signal being at least one of the plurality of input data signals having at least two voltage levels that are different from each other, and provide the first data signal as a second selection signal; and
- a second flip-flop configured to receive the output data signal, a second clock signal, the first reference voltage and the second selection signal, generate a second data signal based thereon, the second data signal being at least one of the plurality of input data signals having at least two voltage levels that are different from each other, the second clock signal being different from the first clock signal, and to provide the second data signal as the first selection signal, wherein the plurality of input data signals, the output data signal and the first and second data signals correspond to the write data or the read data.

20. The memory system of claim 19, wherein:

the memory device includes a high bandwidth memory (HBM) device, the channel includes at least one through silicon via (TSV).

* * * * *